United States Patent
Ji et al.

(10) Patent No.: US 12,411,196 B2
(45) Date of Patent: Sep. 9, 2025

(54) METHOD FOR RECONSTRUCTING QSM MAP USING DIPOLE COMPENSATION

(71) Applicant: SEOUL NATIONAL UNIVERSITY R&DB FOUNDATION, Seoul (KR)

(72) Inventors: Sooyeon Ji, Seoul (KR); Hyeonggeol Shin, Seoul (KR); Jongho Lee, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 237 days.

(21) Appl. No.: 18/329,883

(22) Filed: Jun. 6, 2023

(65) Prior Publication Data
US 2024/0210506 A1 Jun. 27, 2024

(30) Foreign Application Priority Data
Dec. 26, 2022 (KR) ........................ 10-2022-0184584

(51) Int. Cl.
*G01R 33/56* (2006.01)
*G01R 33/58* (2006.01)
(52) U.S. Cl.
CPC ......... *G01R 33/5608* (2013.01); *G01R 33/58* (2013.01)
(58) Field of Classification Search
None
See application file for complete search history.

(56) References Cited

U.S. PATENT DOCUMENTS

| | | | |
|---|---|---|---|
| 2021/0033688 A1* | 2/2021 | Koch | A61B 5/7267 |
| 2022/0358691 A1* | 11/2022 | Ye | G06N 3/094 |
| 2024/0005481 A1* | 1/2024 | Haji-Valizadeh | G01S 15/8977 |

FOREIGN PATENT DOCUMENTS

CN 112488950 A 3/2021

\* cited by examiner

*Primary Examiner* — Rodney E Fuller
(74) *Attorney, Agent, or Firm* — Stuart H. Mayer; Kaplan Breyer Schwarz LLP

(57) ABSTRACT

A method of generating a quantitative susceptibility mapping (QSM) map capable of reconstructing data having various resolutions using a given network trained at a specific resolution includes preparing a local field map having input resolution $resol_{input}$, generating a plurality of sub-images having training resolution $resol_{train}$ by resampling the local field map, inputting each of the sub-images into QSMnet_$resol_{train}$, which is an inference network trained with the training resolution, acquiring a plurality of QSM sub-images having the training resolution $resol_{train}$ from the inference network, generating one QSM assembled map by assembling the plurality of QSM sub-images, and generating a QSM map (corrected QSM map) from the QSM assembled map by applying a dipole compensation method.

13 Claims, 21 Drawing Sheets

[FIG. 1]
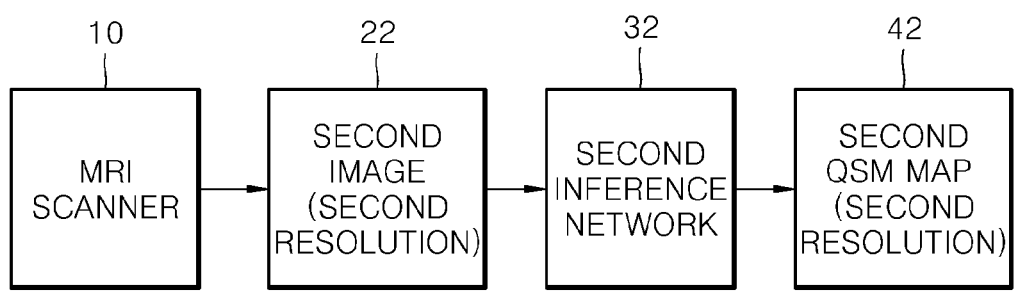
[FIG. 2]
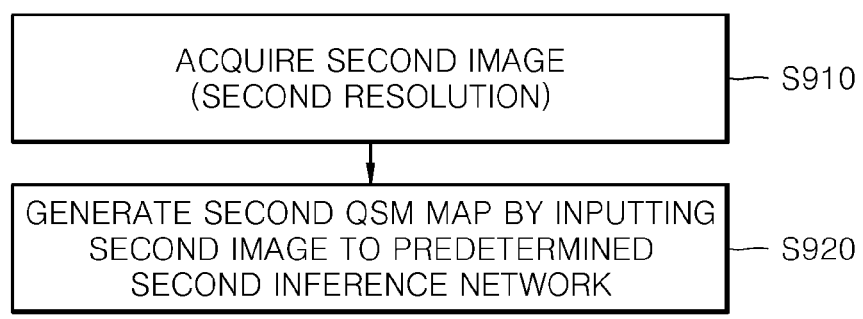

[FIG. 3A]
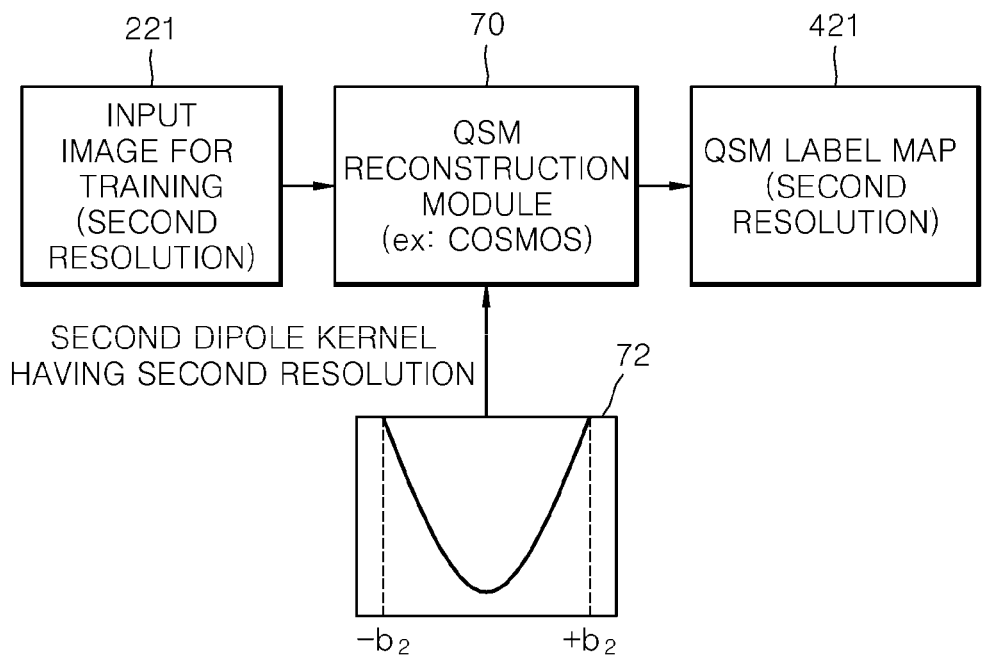
[FIG. 3B]
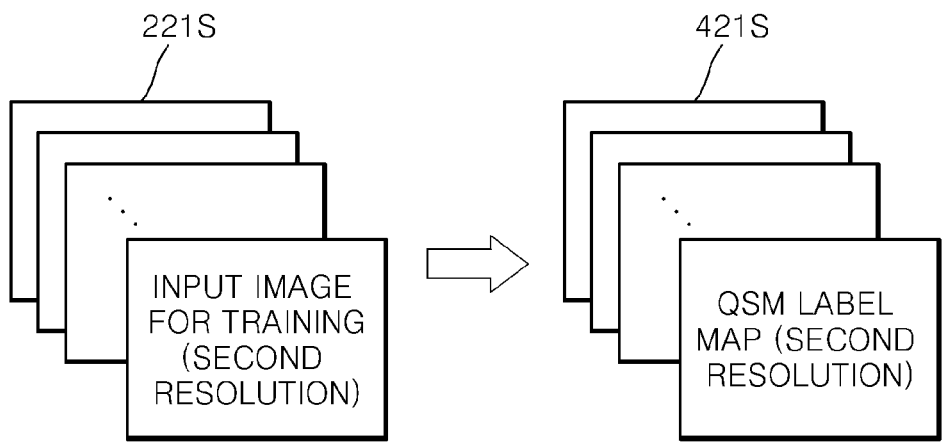

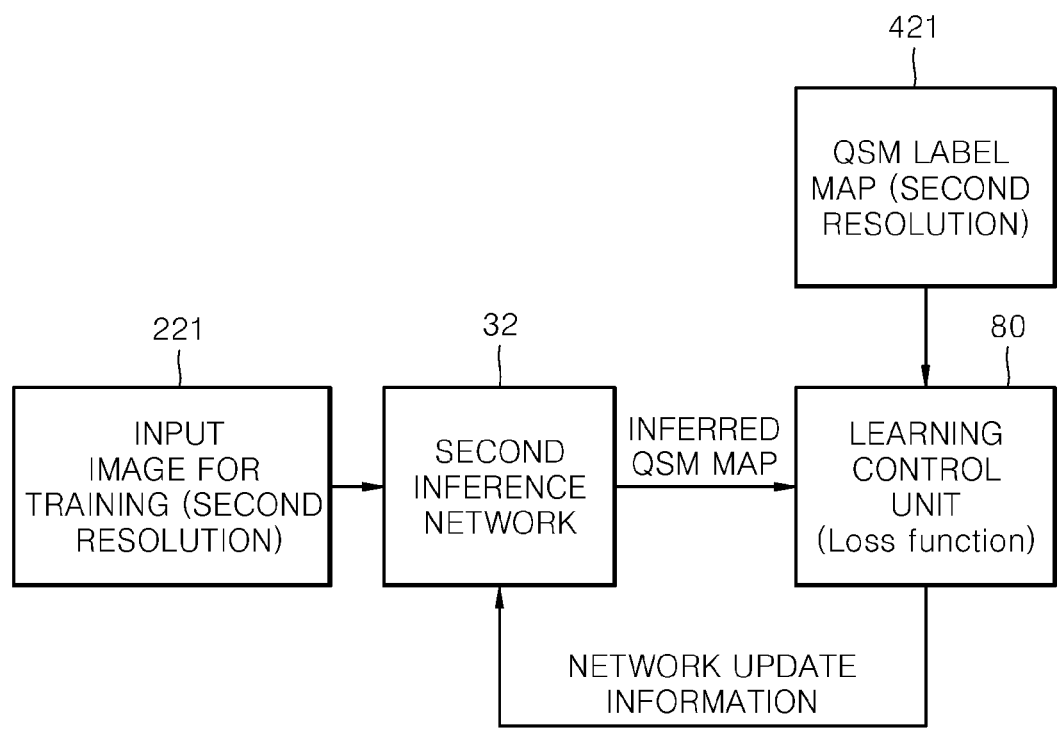
[FIG. 3C]

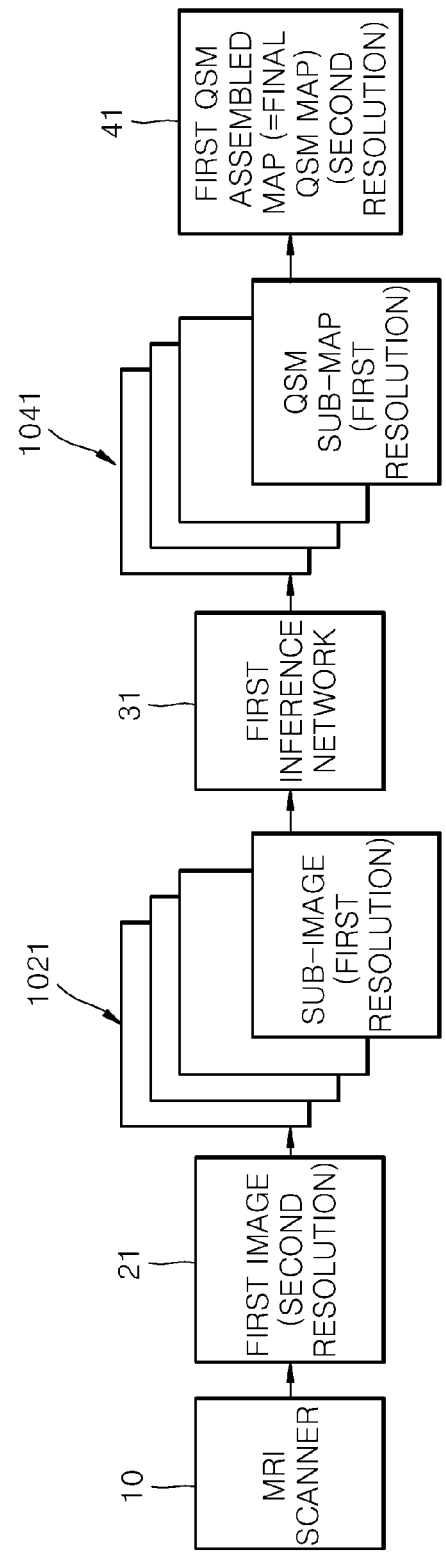

[FIG. 5]
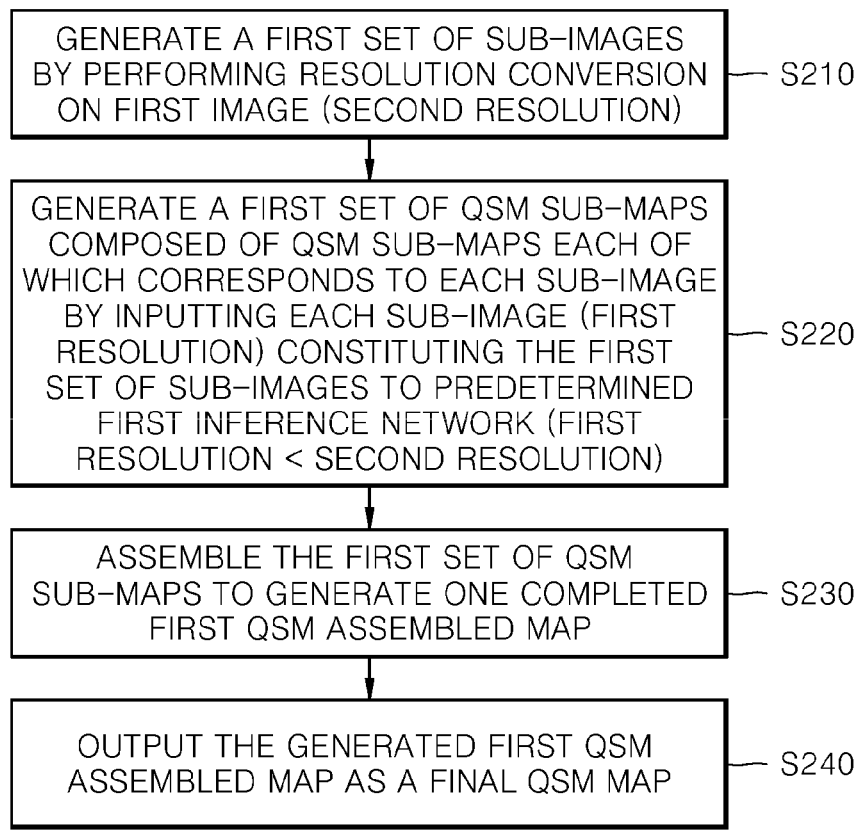

[FIG. 6A]
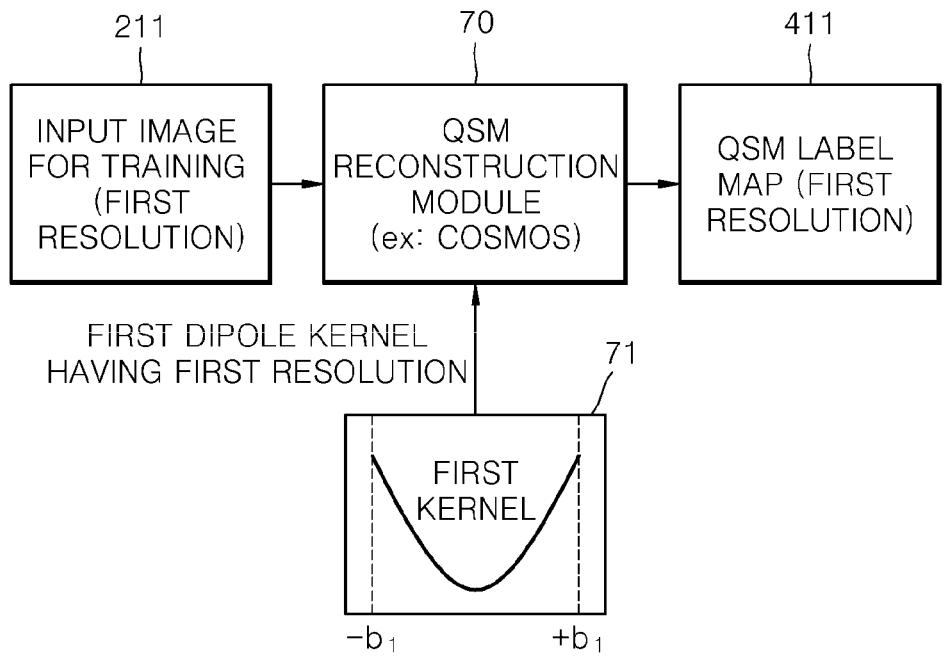
[FIG. 6B]
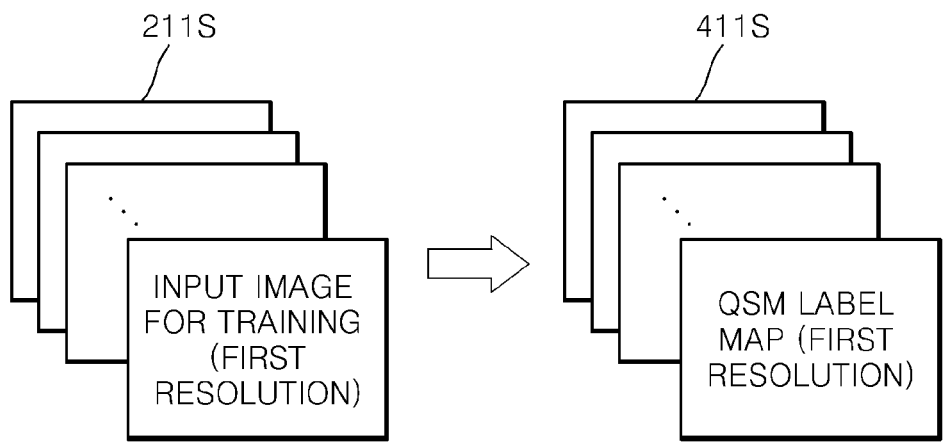

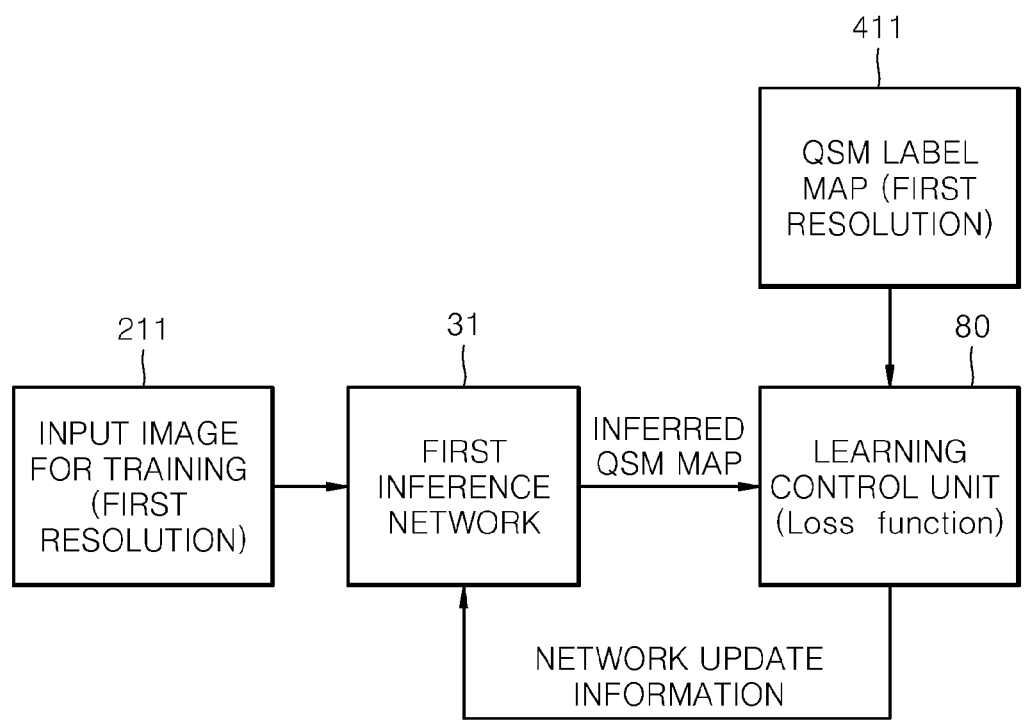

[FIG. 7]
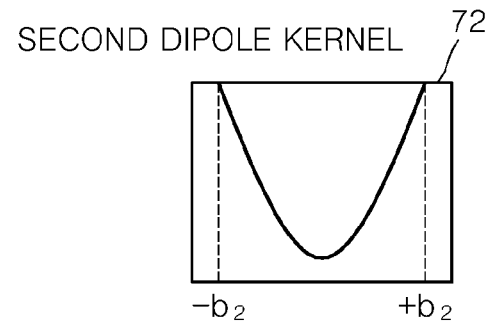
SECOND DIPOLE KERNEL 72
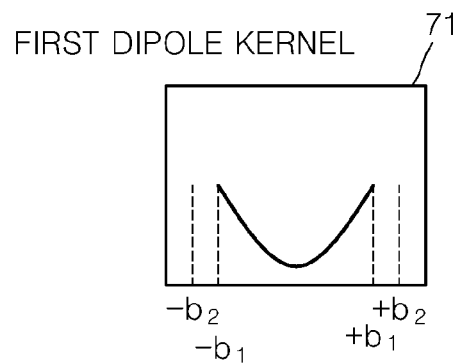
FIRST DIPOLE KERNEL 71
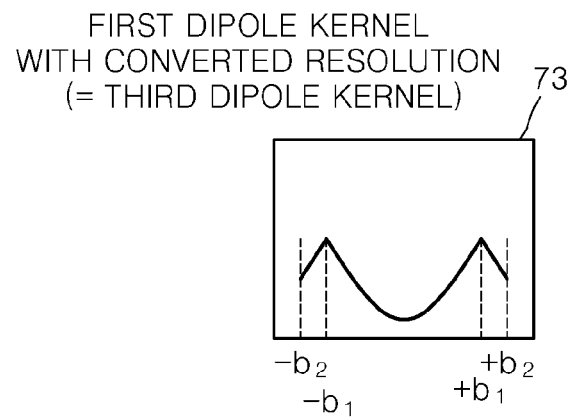
FIRST DIPOLE KERNEL
WITH CONVERTED RESOLUTION
(= THIRD DIPOLE KERNEL) 73

[FIG. 8A]
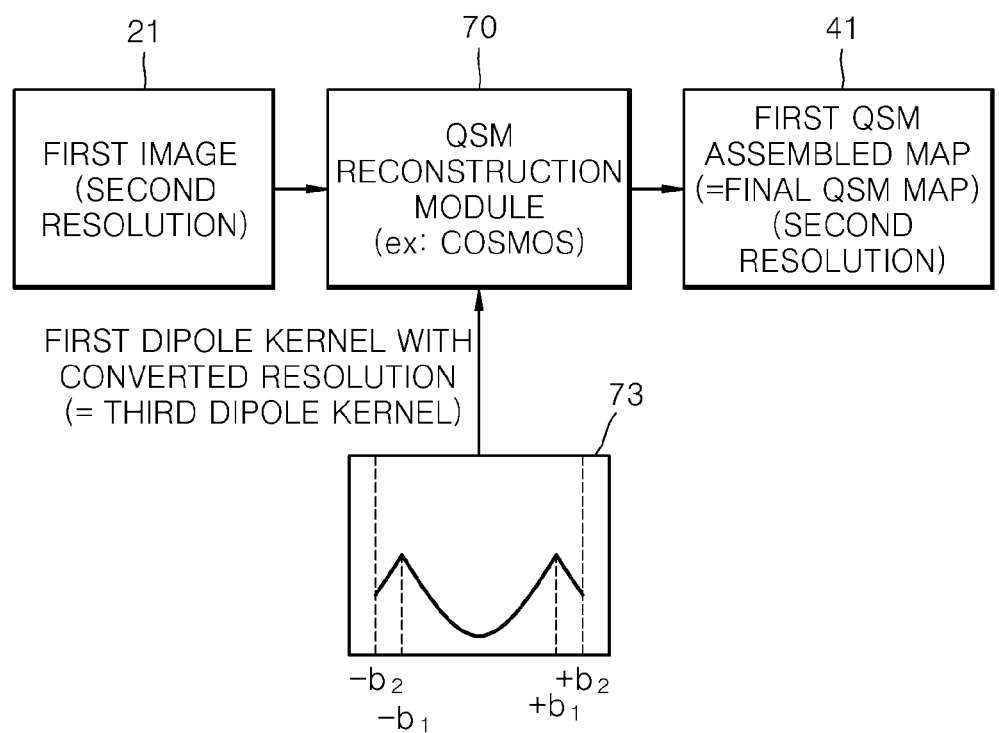

[FIG. 8B]
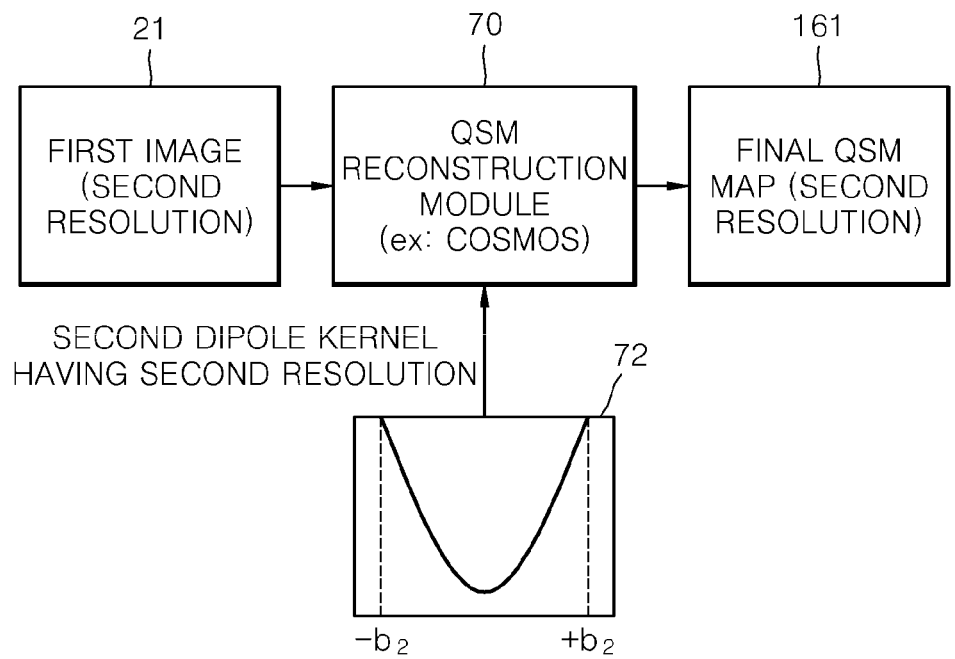

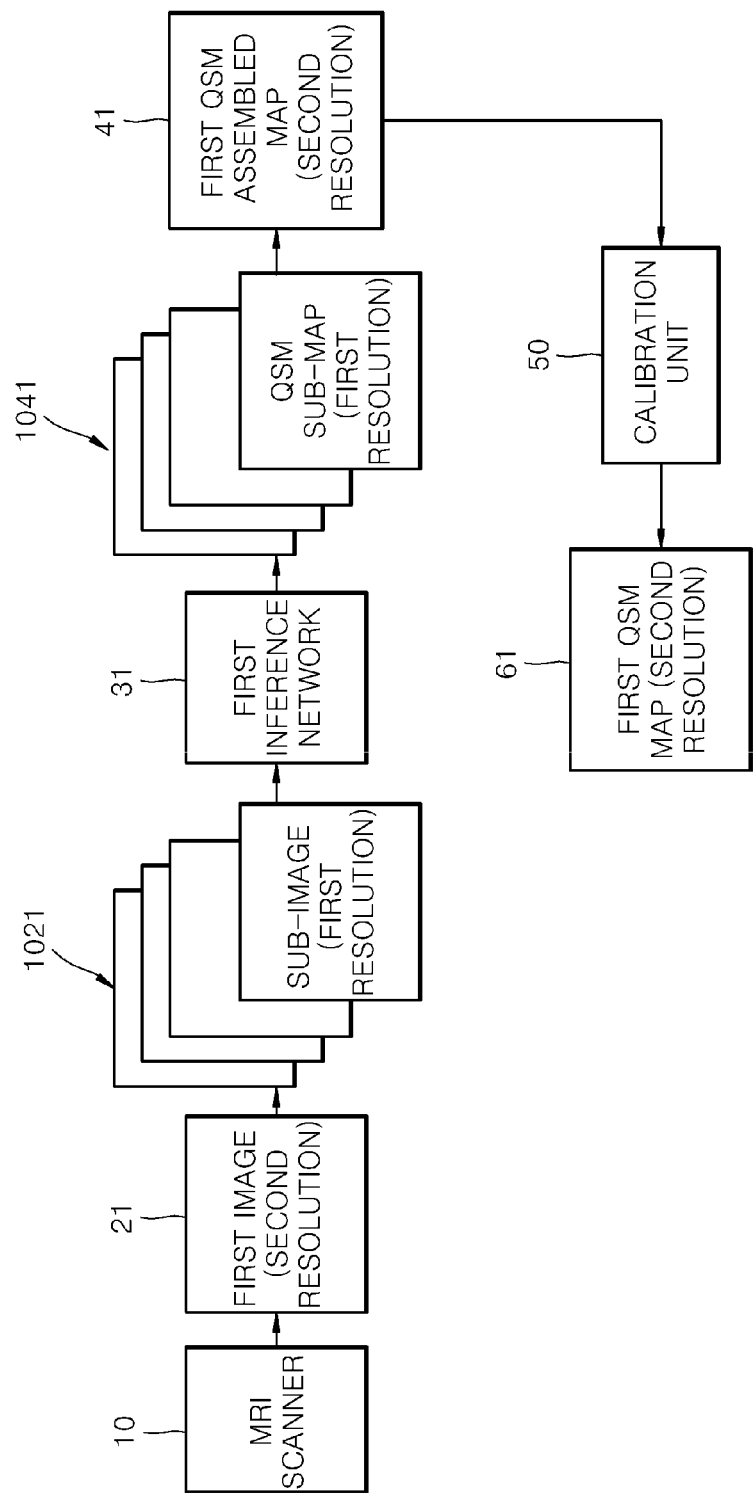
[FIG. 9A]

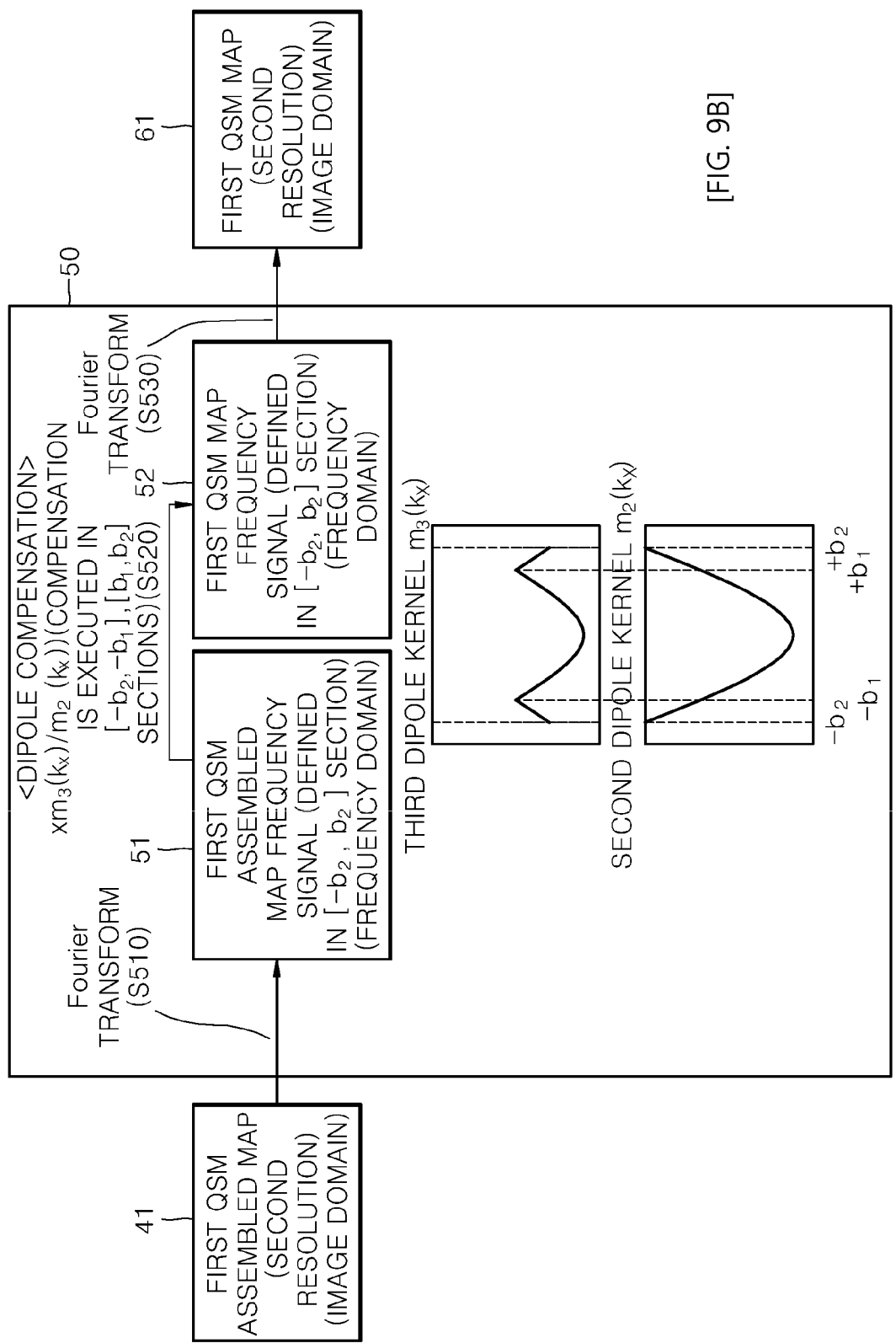
[FIG. 9B]

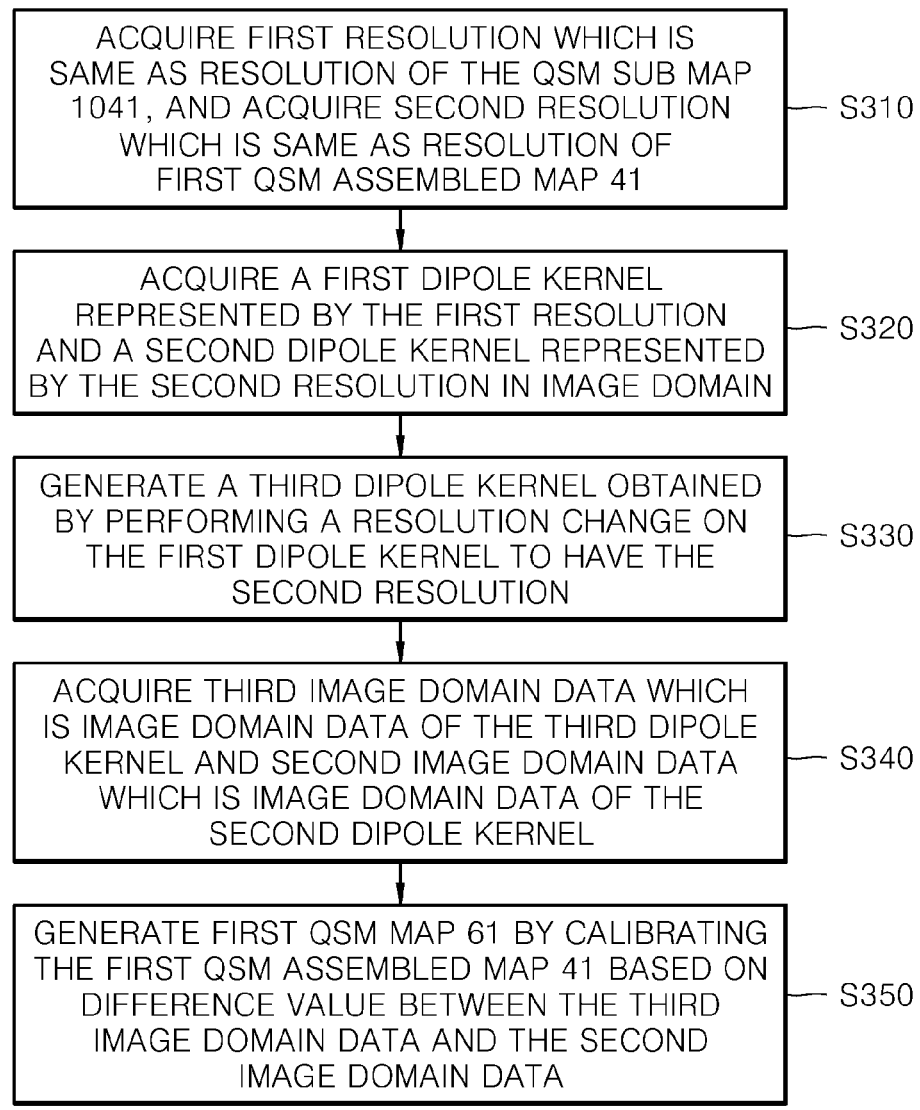
[FIG. 10A]

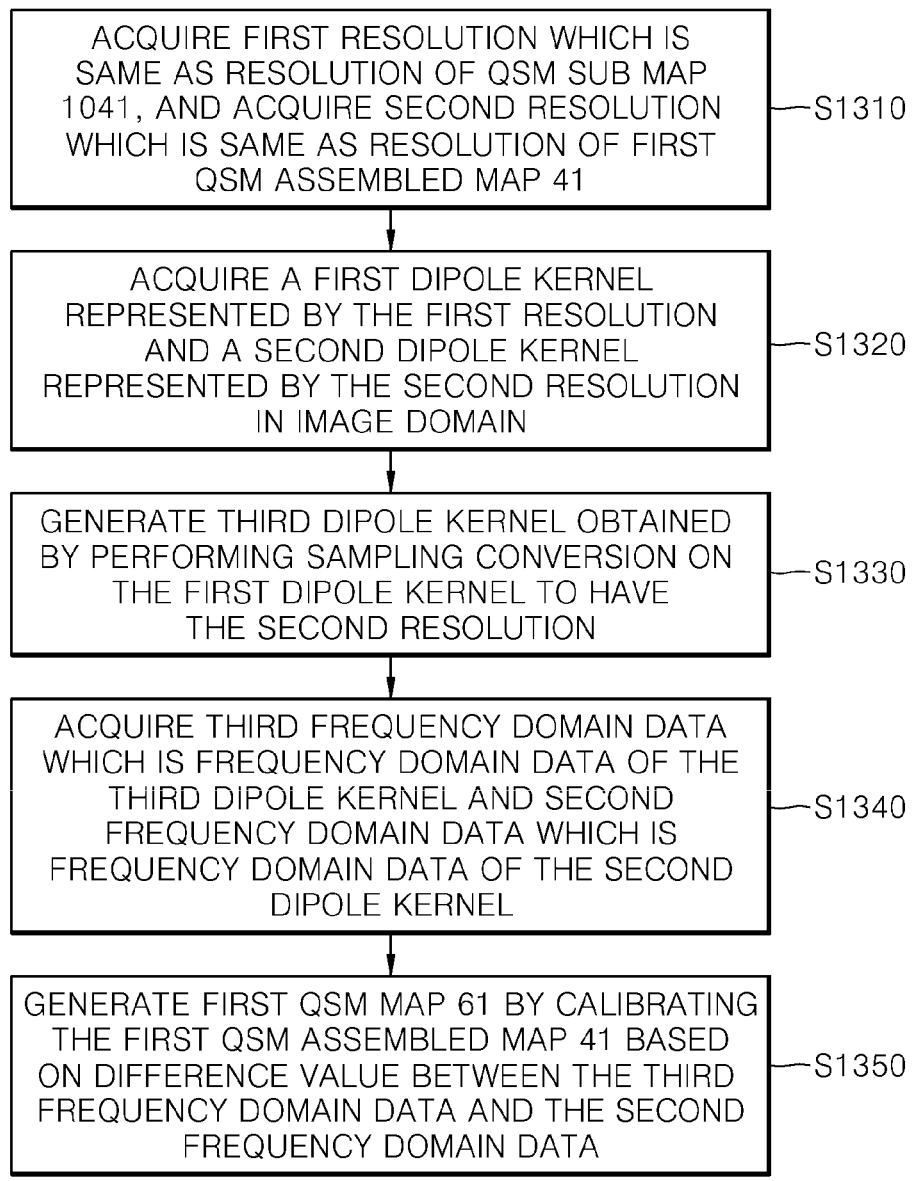

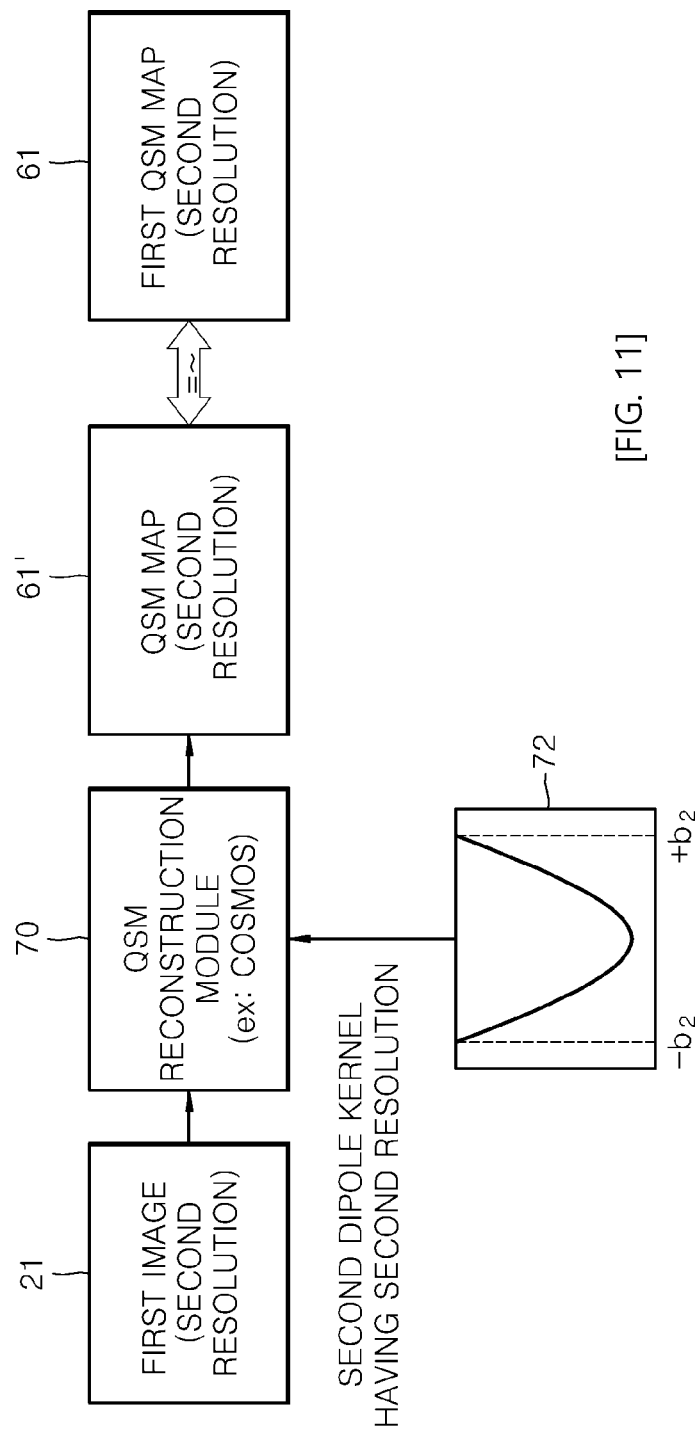
[FIG. 11]

[FIG. 12]
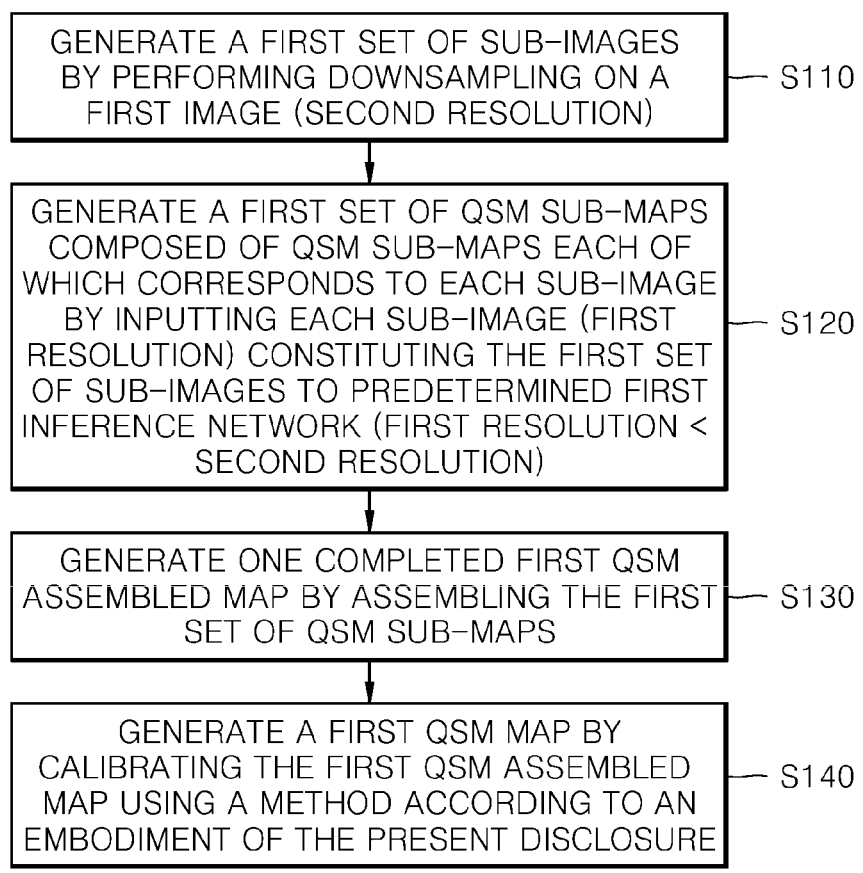

[FIG. 13]
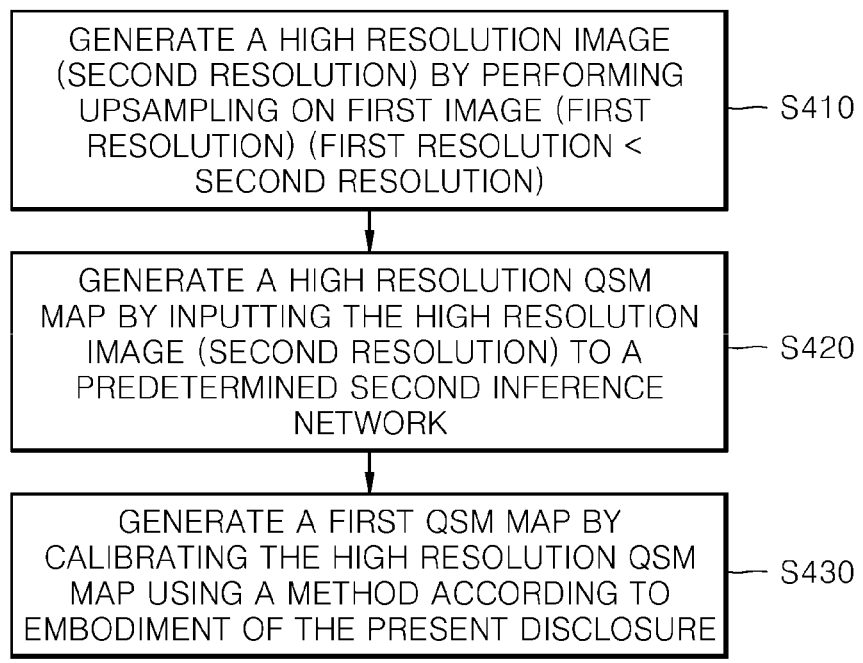

[FIG. 14A]
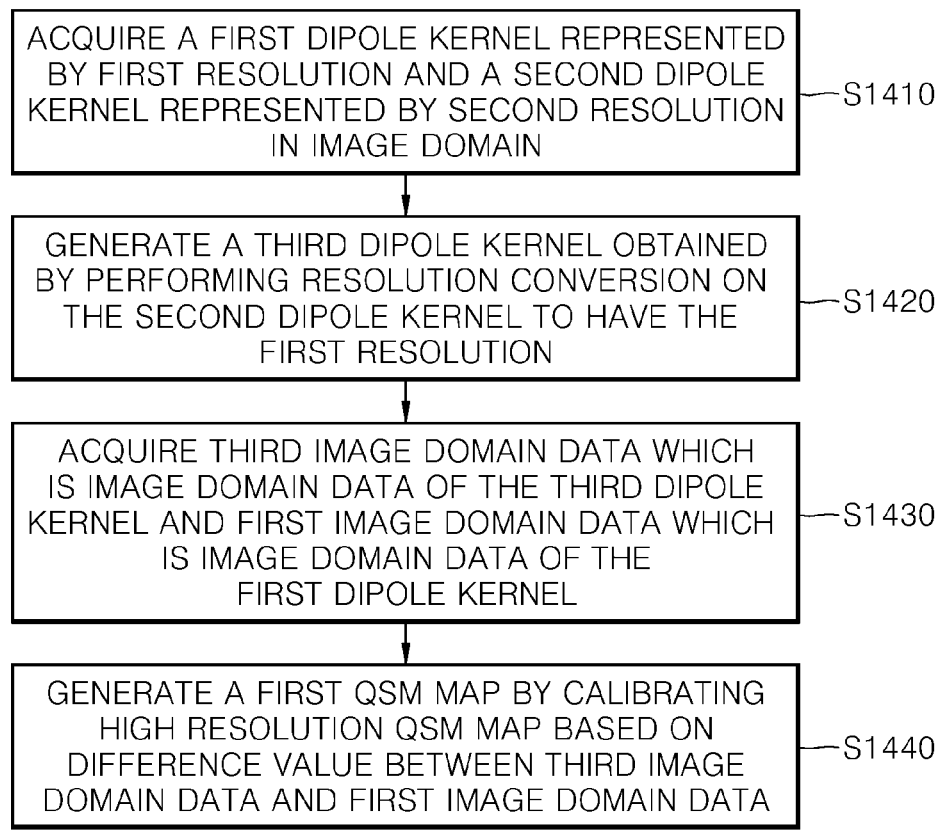

[FIG. 14B]
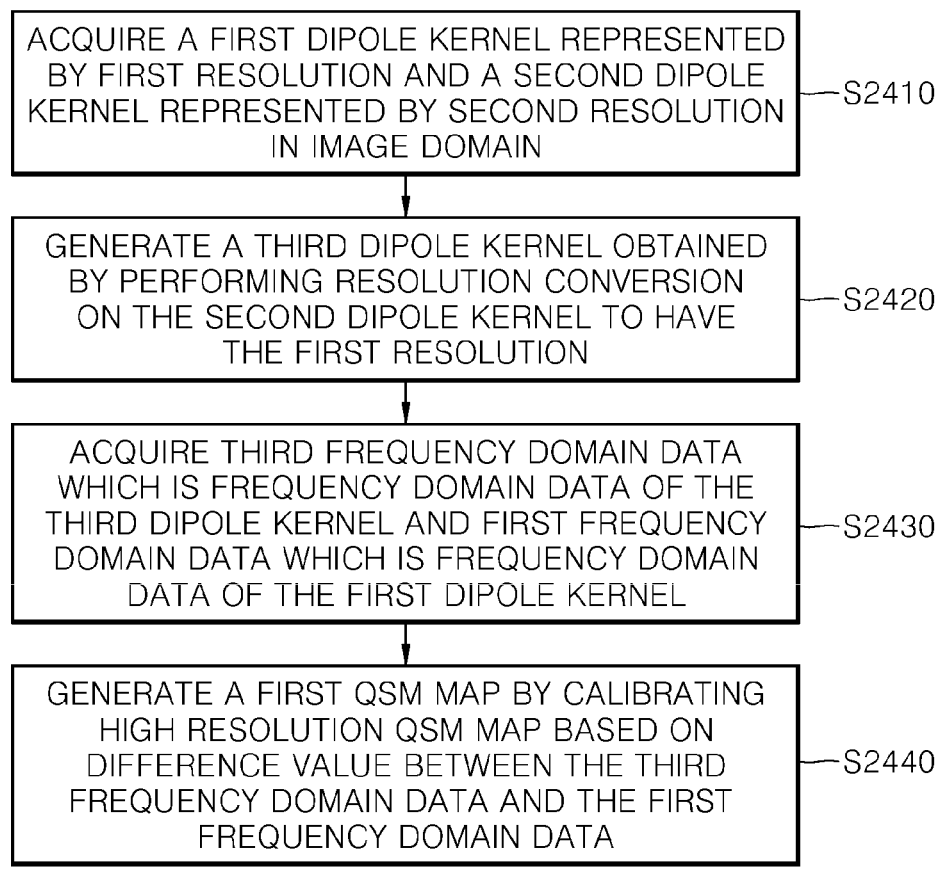

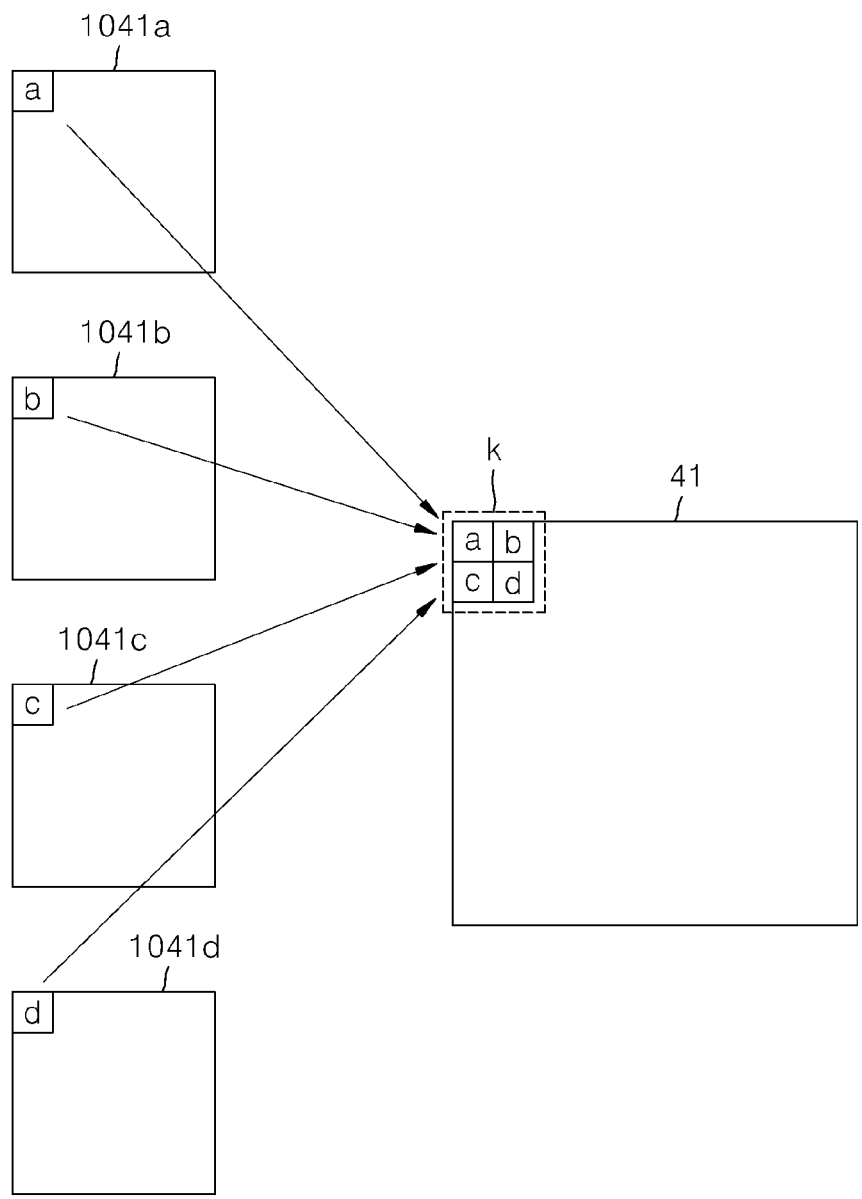
[FIG. 15]

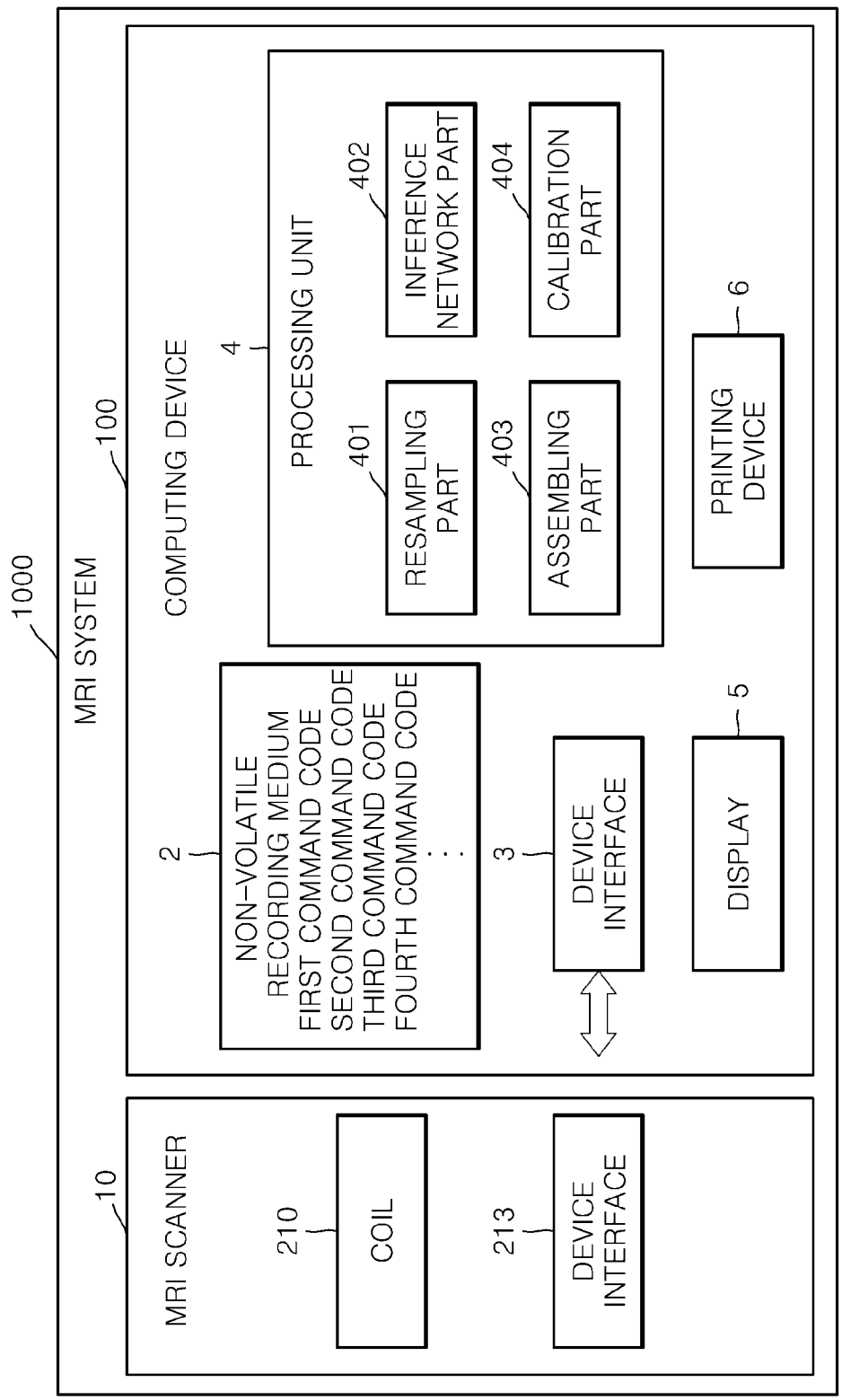
[FIG. 16]

METHOD FOR RECONSTRUCTING QSM MAP USING DIPOLE COMPENSATION

CROSS-REFERENCE TO RELATED APPLICATION

This application claims priority to Korean Patent Application No. 10-2022-0184584 filed on Dec. 26, 2022 and all the benefits accruing therefrom under 35 U.S.C. § 119, the contents of which are incorporated by reference in their entirety.

BACKGROUND

The present disclosure relates to a technique for generating a QSM map using an MRI device and a neural network.

A spatial distribution of magnetic susceptibility may be estimated from a phase of an MR signal acquired by using a gradient echo (GRE) sequence using a quantitative susceptibility mapping (QSM) technique. Theoretically, the result of convolving the QSM map with a dipole kernel becomes an MRI image, and the result of deconvolving the MRI image with the dipole kernel becomes the QSM map.

According to the preferred related art, the QSM map may be reconstructed from the MRI image by a calculation of susceptibility through the multiple orientation sampling (COSMOS) method. Alternatively, the QSM may be reconstructed by an inference network trained by deep learning. Alternatively, the QSM may be reconstructed by any other published methodology.

In order to train the inference network, an MRI input image for training having a specific resolution may be used. If another MRI input image having the specific resolution is input to the inference network trained in this way, the inference network can successfully reconstruct the QSM map (=magnetic susceptibility map). However, there is a problem that if another MRI input image having resolution different from the specific resolution is input to the trained inference network, the inference network fails to reconstruct the QSM map.

SUMMARY

The present disclosure provide a method of generating a QSM map capable of reconstructing data having various resolutions using a given network trained at specific resolution.

In accordance with an exemplary embodiment of the present disclosure, there is provided a method of generating a QSM map including preparing a local field map having input resolution $resol_{input}$, generating a plurality of sub-images having training resolution $resol_{train}$ by resampling the local field map, inputting each of the sub-images into QSMnet_$resol_{train}$, which is an inference network trained with the training resolution, acquiring a plurality of QSM sub-images having the training resolution $resol_{train}$ from the inference network, generating one QSM assembled map by assembling the plurality of QSM sub-images, and generating a QSM map (corrected QSM map) from the QSM assembled map by applying a dipole compensation method, which is a calibration method according to an embodiment of the present disclosure.

The sub-image, the QSM sub-image, and the QSM map may be referred to as a sub-local field map, a QSM sub-map, and the QSM map, respectively.

The assembling may also be achieved by resampling.

The local field map and the QSM map may be images having resolution (=input resolution $resol_{input}$) of a first numerical value, and the sub-image and the QSM sub-image may be images having resolution (=training resolution $resol_{train}$) of a second numerical value different from the first numerical value. For example, the local field map and the QSM map may be images having resolution of 0.5 mm$^3$, and the sub-image and the QSM sub-image may be images having resolution of 1.0 mm$^3$. However, the present disclosure is not limited by specific numbers.

In this case, if the first numerical value is larger than the second numerical value, the resolution of the first numerical value is lower than the resolution of the second numerical value. For example, if the first value is 1.0 mm$^2$ and the second value is 0.5 mm$^2$, the resolution of the first value is lower than that of the second value.

In this case, the resolution of the first numerical value may be isotropic resolution of the first numerical value or anisotropic resolution of the first numerical value. The resolution of the second numerical value may be isotropic resolution of the second numerical value or anisotropic resolution of the second numerical value.

Here, the resolution of the first numerical value may be the input resolution, and the resolution of the second numerical value may be the training resolution.

In this case, the second numerical value may be larger than the first numerical value. That is, the input resolution may be lower than the training resolution.

Alternatively, the second numerical value may be a smaller value than the first numerical value. That is, the input resolution may be higher than the training resolution.

In accordance with another exemplary embodiment of the present disclosure, there is provided a method of generating a QSM map including acquiring, by an MRI system, an image 21 having second resolution by scanning an object using an MRI scanner 10, generating, by the MRI system, a plurality of sub-images 1021 having first resolution from the image 21, generating, by the MRI system, a plurality of QSM sub-maps 1041 having the first resolution from the plurality of sub-images using an inference network 31, and generating, by the MRI system, one QSM assembled map 41 having the second resolution by assembling the plurality of QSM sub-maps 1041 with each other.

In this case, the method of generating the QSM map may further include generating, by the MRI system, a first QSM assembled map frequency signal by Fourier transforming the generated one QSM assembled map after the generating of the one QSM assembled map, generating, by the MRI system, a first QSM map frequency signal by calibrating the generated first QSM assembled map frequency signal based on a difference between a second dipole kernel represented by the second resolution and a third dipole kernel represented by the second resolution, and generating, by the MRI system, a QSM map having the second resolution by Fourier transforming the generated first QSM map frequency signal 52. In this case, the third dipole kernel may be obtained by performing sampling conversion on a first dipole kernel represented by the first resolution so that the first dipole kernel is represented by the second resolution.

In this case, the second resolution may be larger than the first resolution, a first frequency signal, which is a frequency domain signal of the first dipole kernel, may be defined in a section where $k_x$ is $[-b_1, b_1]$, both a second frequency signal, which is a frequency domain signal of the second dipole kernel, and a third frequency signal, which is a frequency domain signal of the third dipole kernel, may be defined in a section where $k_x$ is $[-b_2, b_2]$ ($b_2 > b_1$), the second frequency signal and the third frequency signal may be equal to each other in a section where $k_x$ is $[-b_1, b_1]$, the second frequency signal and the third frequency signal may be different from each other in a section where $k_x$ is $[-b_2, -b_1]$ and a section where $k_x$ is $[b_1, b_2]$, the calibration may be performed in the section where $k_x$ is $[-b_2, -b_1]$ and the section where $k_x$ is $[b_1, b_2]$, a value of the first QSM map frequency signal at $k_x=k$ may be a value obtained by multiplying the value of the first QSM assembled map frequency signal at $k_x=k$ by a predetermined value, the predetermined value may be a value obtained by dividing a value of the third frequency signal at $k_x=k$ by a value of the second frequency signal at $k_x=k$, and the k may be a value belonging to the section where $k_x$ is $[-b_2, -b_1]$ and the section where $k_x$ is $[b_1, b_2]$.

In this case, the inference network may be one that is trained by supervised learning using a plurality of input images for training having the first resolution and using a plurality of QSM maps generated from the plurality of input images for training as labels.

In this case, the method of generating the QSM map may further include, after the generating of the one QSM assembled map, generating, by the MRI system, a QSM map having the second resolution by calibrating the one QSM assembled map. And, the calibration may be performed based on a difference between the second dipole kernel having the second resolution and the first dipole kernel having the first resolution.

In this case, the method of generating the QSM map may include preparing a third dipole kernel that may be obtained by performing resolution conversion on the first dipole kernel to have the second resolution and generating the QSM map from the QSM assembled map by compensating for a difference between the third dipole kernel and the second dipole kernel.

In this case, all of the plurality of sub-images may have the same horizontal and vertical size, all of the plurality of QSM sub-maps may have the same horizontal and vertical size, and the second resolution may be larger than the first resolution.

In this case, a plurality of pixels included in a first region of the QSM assembled map may include a plurality of pixels located at first positions corresponding to each other in the plurality of QSM sub-maps.

In this case, the plurality of sub-images may be different images obtained by performing downsampling on the image.

In accordance with yet another exemplary embodiment of the present disclosure, there is provided a method of generating a QSM map including acquiring, by an MRI system, an image having first resolution by scanning an object using an MRI scanner, generating, by the MRI system, one upsampling image having second resolution larger than the first resolution from the image, generating, by the MRI system, one QSM upsampling map having the second resolution from the upsampling image using an inference network, and generating, by the MRI system, one QSM map having the first resolution by calibrating the one QSM upsampling map having the second resolution.

In accordance with still another exemplary embodiment of the present disclosure, there is provided an MRI system including an MRI scanner and a computing device. In this case, the computing device is configured to execute acquiring an image having second resolution by scanning an object using the MRI scanner, generating a plurality of sub-images having first resolution from the image, generating a plurality of QSM sub-maps having the first resolution from the plurality of sub-images using an inference network, and generating one QSM assembled map having the second resolution by assembling the plurality of QSM sub-maps with each other.

In this case, the computing device may be configured to further execute generating a first QSM assembled map frequency signal by Fourier transforming the generated one QSM assembled map after the generating of the one QSM assembled map, generating a first QSM map frequency signal by calibrating the generated first QSM assembled map frequency signal based on a difference between a second dipole kernel represented by the second resolution and a third dipole kernel represented by the second resolution, and generating a QSM map having the second resolution by Fourier transforming the generated first QSM map frequency signal. Also, the third dipole kernel may be obtained by performing sampling conversion on a first dipole kernel represented by the first resolution so that the first dipole kernel is represented by the second resolution.

In this case, the inference network may be one that is trained by supervised learning using a plurality of input images for training having the first resolution and using a plurality of QSM maps generated from the plurality of input images for training as labels.

In this case, the computing device may be configured to further execute generating a QSM map having the second resolution by calibrating the one QSM assembled map after the generating of the one QSM assembled map, and the calibration may be performed based on a difference between the second dipole kernel having the second resolution and the first dipole kernel having the first resolution.

In accordance with yet still another exemplary embodiment of the present disclosure, there is provided a method of generating a QSM map including acquiring, by a computing device, an image 21 having second resolution by scanning an object using an MRI scanner 10, generating, by the computing device, a plurality of sub-images 1021 having first resolution from the image 21, generating, by the computing device, a plurality of QSM sub-maps 1041 having the first resolution from the plurality of sub-images using an inference network 31, generating, by the computing device, one QSM assembled map 41 having the second resolution by assembling the plurality of QSM sub-maps 1041, and generating, by the computing device, a QSM map having the second resolution by calibrating the one QSM assembled map. In this case, the calibration is performed based on a difference between a second dipole kernel having the second resolution and a first dipole kernel having the first resolution.

BRIEF DESCRIPTION OF THE DRAWINGS

Exemplary embodiments can be understood in more detail from the following description taken in conjunction with the accompanying drawings, in which:

FIG. 1 is a block diagram illustrating a method of generating a QSM map according to a comparative embodiment;

FIG. 2 is a flow chart illustrating the Method of generating the QSM map of FIG. 1;

FIG. 3A is a diagram illustrating a process of preparing data for training a second inference network;

FIG. 3B illustrates a concept of generating a QSM label map using an input image for training having second resolution;

FIG. 3C is a diagram illustrating a method of training the second inference network using a second set of input images for training and a second set of QSM label maps prepared in FIG. 3B;

FIG. 4 is a block diagram illustrating a method of generating a QSM map in accordance with an exemplary embodiment of the present disclosure;

FIG. 5 is a flowchart illustrating the method of generating the QSM map of FIG. 4;

FIG. 6A is a diagram illustrating a process of preparing data for training the first inference network;

FIG. 6B illustrates a concept of generating a QSM label map using an input image for training having first resolution;

FIG. 6C is a diagram illustrating a method of training the first inference network using a first set of input images for training and a first set of QSM label maps prepared in FIG. 6B;

FIG. 7 illustrates a shape of a dipole kernel in a frequency domain;

FIG. 8A is a diagram for describing the cause of distortion present in a QSM assembled map generated according to the embodiment shown in FIG. 4;

FIG. 8B illustrates a process of accurately generating a QSM map from the first image of FIG. 8A;

FIG. 9A is a block diagram illustrating a method of generating a QSM map in accordance with a preferred embodiment of the present disclosure;

FIG. 9B is a diagram illustrating an operating principle of a calibration unit illustrated in FIG. 9A;

FIG. 10A is a flowchart illustrating a method of calibrating a reconstructed QSM map in accordance with an exemplary embodiment of the present disclosure;

FIG. 10B is a flowchart illustrating a method of calibrating a reconstructed QSM map in accordance with another exemplary embodiment of the present disclosure;

FIG. 11 is a block diagram for describing the accuracy of a QSM map generated according to a method of reconstructing a QSM map in accordance with the embodiment of the present disclosure shown in FIG. 9A;

FIG. 12 is a flowchart illustrating a method of generating a QSM map in accordance with still another exemplary embodiment of the present disclosure;

FIG. 13 is a flowchart illustrating a method of generating a QSM map in accordance with yet still another exemplary embodiment of the present disclosure;

FIG. 14A is a flowchart illustrating a method of calibrating a high-resolution QSM map in FIG. 13 according to an embodiment;

FIG. 14B is a flowchart illustrating a method of calibrating the high-resolution QSM map in FIG. 13 according to another embodiment;

FIG. 15 is a diagram illustrating an assembling method shown in FIG. 9A; and

FIG. 16 is a diagram illustrating a configuration of an MRI system implementing a method of generating a QSM map in accordance with yet still another exemplary embodiment of the present disclosure.

DETAILED DESCRIPTION OF EMBODIMENTS

Hereinafter, specific embodiments of the present disclosure will be described in detail with reference to the accompanying drawings. However, the present disclosure is not limited to the specific embodiments described herein and may be implemented in various other forms. Terms used in this specification are intended to aid understanding of the embodiments, and are not intended to limit the scope of the present invention. Also, the singular forms used below include the plural forms unless the phrases clearly indicate the contrary.

Embodiment 1—Comparative Embodiment

FIG. 1 is a block diagram illustrating a method of generating a QSM map according to a comparative embodiment.

FIG. 2 is a flow chart illustrating the Method of generating the QSM map of FIG. 1.

Referring to FIG. 1, an MRI scanner 10 may be a module that outputs an MRI image. More specifically, the MRI scanner 10 may be a module that outputs a local field map obtained by post-processing a phase of an MRI image obtained by a GRE method. Hereinafter, the local field map may be simply referred to as an MRI image.

A second image 22 may be the MRI image output by the MRI scanner 10. In this case, resolution of the second image 22 may be second resolution having a specific value.

The second image 22 may be input to a second inference network 32 that has already been trained. The second inference network 32 may include a second neural network.

The second inference network 32 is configured to output a second QSM map 42 based on the input second image 22. The second QSM map 42 has the second resolution.

The MRI scanner 10 and the second inference network 32 may be computing parts included in an MRI device.

The second image 22 and the second QSM map 42 may be information generated by the MRI device.

Referring to FIG. 2, a method of generating a QSM map provided according to an embodiment of the present disclosure includes acquiring the second image 22 (S910) and generating the second QSM map 42 by inputting the second image 22 to a predetermined second inference network 32 (S920).

In this case, the second inference network 32 may be a network that receives an MRI image and outputs a QSM map corresponding to the input MRI image.

In this case, the second inference network 32 may be a network including a second neural network. Alternatively, the second inference network 32 may be the second neural network itself. The second inference network 32 may be obtained by training the second neural network.

In this case, the second neural network may be one that is trained using a second set of input images for training having the same size as the second image.

Hereinafter, FIGS. 3A, 3B, and 3C may be collectively referred to as FIG. 3.

FIG. 3 illustrates a method of training the second inference network shown in FIG. 1.

FIG. 3A is a diagram illustrating a process of preparing data for training the second inference network.

A QSM label map 421 having the second resolution may be generated by inputting an input image 221 for training having the second resolution to any known QSM map reconstruction module 70.

In this case, the input image 221 for training may be the MRI image.

The QSM map reconstruction module 70 may be, for example, COSMOS, but is not limited thereto.

In this case, in order to operate the QSM map reconstruction module 70, the QSM map reconstruction module 70 uses a second dipole kernel having the second resolution.

The second dipole kernel is represented by a three-dimensional dipole shape in an image domain, and if the three-dimensional dipole shape is Fourier-transformed, it can be transformed into a second frequency signal in a frequency domain composed of x, y, and z frequency axes, and vice versa. That is, a dipole kernel may be represented by a shape in the image domain or a shape in the frequency domain through Fourier transform.

A section where a frequency signal obtained by Fourier transforming the dipole kernel is defined in the frequency domain depends on resolution of the dipole kernel in the image domain.

Therefore, since the second dipole kernel has the second resolution in the image domain, the second frequency signal obtained by Fourier transforming the second dipole kernel is defined in a section where $k_x$ is $[-b_2, b_2]$.

In this specification, the term for a section where $k_x$ is [a, b] may mean a section where $k_x$ is larger than a and smaller than b.

As shown in FIG. 3B, when a second set of input images 221S for training composed of input images for training having the second resolution are prepared, a QSM label map 421 corresponding to each input image 221 for training may be generated using the method shown in FIG. 3A. Accordingly, a second set of QSM label maps 421S may be generated from the second set of input images 221S for training. All of the QSM label maps 421 have the second resolution.

Each of the QSM label maps 421 may be used as a label for supervised learning using the corresponding input image 221 for training.

FIG. 3C is a diagram illustrating a method of training the second inference network 32 using the second set of input images 221S for training and the second set of QSM label maps 421S prepared in FIG. 3B.

When the input image 221 for training is input to the second inference network 32, the second inference network 32 outputs an inferred QSM map.

A learning control unit 80 may update internal parameters of the second inference network 32 according to a loss function defined by the inferred QSM map and the QSM label map 421 corresponding to the input image 221 for training.

The update may be repeated for all of the group of input images 221S for training, and as a result of the repetition, the second inference network 32 may be trained.

In the above comparative embodiment, if the sizes of the second image 22 and the second set of input images 221S for training have the second resolution larger than a predetermined resolution, it may be difficult to acquire the second set of input images 221S for training. This is because when the second set of input images 221S for training are the MRI images, it may be impossible or difficult to obtain MRI images having high-resolution from an institution that provides the MRI images having high-resolution.

In addition, even if it is assumed that the second set of input images 221S for training can be obtained, there is a disadvantage in that the complexity of the second neural network for learning the second set of input images increases and a lot of computing power and time may be required for the learning process.

Therefore, in the case of the comparative embodiment, there is a problem in that it may be difficult to implement when resolution of the second image is larger than a predetermined resolution.

Embodiment 2—One Embodiment of the Present Disclosure

As described above, if the second image 22 and the second set of input images 221S for training have the second resolution larger than the predetermined resolution, it may be impossible or difficult to acquire the second set of input images 221S for training. Accordingly, it may not be possible to complete the second inference network 32 by training the second neural network.

In contrast, acquiring a first set of input images for training having first resolution smaller than the predetermined resolution is generally easier than acquiring the second set of input images for training (first resolution<second resolution).

Therefore, a first inference network including a first neural network capable of receiving the first set of input images for training may be prepared by acquiring the first set of input images for training and training the first neural network.

Hereinafter, an embodiment of generating a QSM map by transforming a given MRI image will be described on the assumption that the second inference network cannot be prepared, and the first inference network can be prepared instead.

FIG. 4 is a block diagram illustrating a method of generating a QSM map according to an embodiment of the present disclosure.

FIG. 5 is a flowchart illustrating the method of generating the QSM of FIG. 4.

Referring to FIG. 4, the MRI scanner 10 may be a module that outputs the MRI image. More specifically, the MRI scanner 10 may be a module that outputs the local field map obtained by post-processing a phase of an MRI image obtained by the GRE method. Hereinafter, the local field map may be simply referred to as the MRI image.

A first image 21 may be the MRI image output by the MRI scanner 10. In this case, resolution of the first image 21 may be second resolution larger than the predetermined resolution.

The first image 21 may be subjected to downsampling to generate a first set of sub-images 1021. For example, the first image 21 may be divided into N sub-images 1021.

In this case, each sub-image 1021 may be an image generated by being subjected to downsampling from the first image 21, and may be referred to as an MRI sub-image in this specification. The MRI sub-image is a kind of MRI image.

In this case, all of the N sub-images 1021 may be images having the 'first resolution' smaller than the predetermined resolution.

In this case, the second resolution, which is the size of the first image 21, may be larger than the first resolution, which is the size of each sub-image 1021.

The sub-image 1021 may be input to a first inference network 31 that has already been trained. The first inference network 31 may include the first neural network.

The first inference network 31 is configured to output a QSM sub-map 1041 based on the input sub image 1021. The QSM sub-map 1041 has the first resolution.

N QSM sub-maps 1041 may be generated from the N sub-images 1021.

The N QSM sub-maps 1041 may be assembled with each other to generate a first QSM assembled map 41, which is an image of higher resolution. The first QSM assembled map 41 may also be referred to as a final QSM map, hereinafter.

The first QSM assembled map 41 has the second resolution.

Hereinafter, the flowchart of FIG. 5 will be described.

In step S210, a computing device may generate the first set of sub-images 1021 by performing resolution conversion (=sampling conversion) on the first image 21 with second resolution.

In this case, the resolution conversion may be downsampling or upsampling. When the resolution conversion is downsampling, the first set of sub-images are a plurality of images, and resolution of each sub-image may be smaller than that of the first image. In contrast, when the resolution conversion is upsampling, the first set of sub-images is one image, and resolution of the one image may be larger than that of the first image.

In step S220, the computing device may generate a first set of QSM sub-maps 2041 composed of the QSM sub-maps 1041 each of which corresponds to each sub-image 1021 by inputting each sub-image constituting the first set of sub-images 1021 to the predetermined first inference network 31.

In this case, the first inference network 31 may be a network that receives an MRI image and outputs a QSM map corresponding to the input MRI image. Accordingly, when one sub-image 1021 is input to the first inference network 31, the first inference network 31 may output one QSM sub-map 1041.

In this case, the first inference network 31 may be a network including the first neural network. Alternatively, the first inference network 31 may be the first neural network itself. The first inference network 31 may be one that is obtained by training the first neural network.

In this case, the first neural network may be one that is trained using the first set of input images for training having the first resolution that is the same size as the sub-image 1021.

If the first set of sub-images 1021 is composed of a total of N sub-images, each of the N sub-images may be sequentially input to the first inference network 31, and the first inference network 31 may sequentially output N QSM sub-maps 1041 corresponding to the N sub-images 1021. That is, the first inference network 31 may output the first set of QSM sub-maps 1041 corresponding to the first set of sub-images 1021.

In a modified embodiment, the first inference network 31 may process k sub-images among the N sub-images 1021 in parallel and output k QSM sub-maps corresponding to the k sub-images at once (1<=k<N).

In step S230, the computing device may assemble the first set of QSM sub-maps to generate one completed first QSM assembled map 41.

In this case, the size of the first QSM assembled map 41 may be larger than the size of each QSM sub-map 1041.

In step S240, the computing device may output the generated first QSM assembled map 41 as the final QSM map.

In this case, the first neural network may be one that is trained using the second set of input images 211 for training having the same first resolution as the first set of the sub-images 1021.

Hereinafter, FIGS. 6A, 6B, and 6C may be collectively referred to as FIG. 6.

FIG. 6 illustrates a method of training the first inference network 31 shown in FIG. 4.

FIG. 6A is a diagram illustrating a process of preparing data for training the first inference network 31.

A QSM label map 411 having first resolution may be generated by inputting an input image 211 for training having the first resolution to any known QSM map reconstruction module 70.

In this case, the input image 211 for training may be the MRI image.

The QSM map reconstruction module 70 may be, for example, the COSMOS, but is not limited thereto.

In this case, in order to operate the QSM map reconstruction module 70, the QSM map reconstruction module 70 uses a first dipole kernel having the first resolution.

The first dipole kernel is represented by a three-dimensional dipole shape in an image domain, and if the three-dimensional dipole shape is Fourier-transformed, it can be transformed into a first frequency signal in a frequency domain composed of x, y, and z frequency axes, and vice versa.

A section where a frequency signal obtained by Fourier transforming a dipole kernel is defined in the frequency domain depends on resolution of the dipole kernel in the image domain.

Therefore, since the first dipole kernel has the first resolution in the image domain, the first frequency signal that may be obtained by Fourier transforming the first dipole kernel is defined in a section where $k_x$ is $[-b_1, b_1]$.

In this case, the second frequency signal described in Embodiment 1 is defined in the section where $k_x$ is $[-b_2, b_2]$, whereas the first frequency signal in Embodiment 2 is defined in the section where $k_x$ is $[-b_1, b_1]$. Here, since the first resolution is lower than the second resolution, a relationship of $b_1<b_2$ is established. The effect of this relationship should be compensated. This will be described later.

As shown in FIG. 6B, when a first set of input images 211S for training composed of input images for training having the first resolution is prepared, the QSM label map 411 corresponding to each input image 211 for training may be generated using the method shown in FIG. 6A. Accordingly, a first set of QSM label maps 411S may be generated from the first set of input images 211S for training. All of the QSM label maps 411 have the first resolution.

Each of the QSM label maps 411 can be used as a label for supervised learning using the corresponding input image 211 for training.

FIG. 6C is a diagram illustrating a method of training the first inference network 31 using the first set of input images 211S for training and the first set of QSM label maps 411S prepared in FIG. 6B.

When the input image 211 for training is input to the first inference network 31, the first inference network 31 outputs an inferred QSM map.

The learning control unit 80 may update internal parameters of the first inference network 31 according to a loss function defined by the inferred QSM map and the QSM label map 411 corresponding to the input image 211 for training.

The update may be repeated for all of the group of input images 211S for training, and as a result of the repetition, the first inference network 31 may be trained.

As described above, the technique according to the first embodiment (comparative embodiment) has a problem in that it cannot be implemented if the second set of input images for training having the second resolution larger than the predetermined resolution cannot be prepared.

In contrast, the technique according to the second embodiment can be implemented because it is easy to prepare the first set of input images for training having the first resolution smaller than the predetermined resolution. However, the technique according to the second embodiment also has the following problems.

FIG. 7 illustrates a shape of a dipole kernel in the frequency domain.

In FIG. 7, the horizontal axis of the graph represents $k_x$ in the frequency domain, and the vertical axis represents a Fourier transform value at $k_x$. The graphs illustrated in FIG.

7 are graphs illustrating values in the frequency domain of a specific direction (ex: $k_x$) of the dipole kernel.

In the upper part of FIG. 7, a second frequency signal 72, which is a frequency domain signal of a second dipole kernel having second resolution in the image domain, is shown.

In the middle of FIG. 7, a first frequency signal 71, which is a frequency domain signal of a first dipole kernel having first resolution lower than the second resolution in the image domain, is shown.

Since the first resolution is lower than the second resolution, the first kernel is defined in the section $[-b_1, b_1]$ in the frequency axis, whereas the second kernel is defined in the section $[-b_2, b_2]$ in the frequency axis. In this case, $b_2 > b_1$.

In the lower part of FIG. 7, a third frequency signal 73, which is a frequency domain signal of a third dipole kernel (=first dipole kernel with converted resolution) obtained by performing resolution conversion on the first dipole kernel having the first resolution to have the second resolution, is shown.

In this case, in one embodiment, when the second resolution is higher than the first resolution, image pixels of the first dipole kernel in the image domain are converted in such a way as being isotropically spaced apart from each other to make the image of the converted first dipole kernel have the second resolution, and then, a pixel having a value of zero (0) is inserted into the spaced empty space, thereby capable of executing the resolution conversion.

FIG. 7 illustrates the first frequency signal 71, the second frequency signal 72, and the third frequency signal 73 only along one direction axis for convenience.

Therefore, when the third frequency signal 73 is represented in the $[-b_2, b_2]$ section, it has a shape in which the shape of the kernel is repeated as shown in the lower part of FIG. 7. It can be seen that the third frequency signal 73 has a distorted shape compared to the second frequency signal 72.

Now, referring back to reference numerals 1041 and 41 of FIG. 4, an assembling process of generating the first QSM assembled map 41 having the second resolution by assembling the first group of QSM sub-maps of having the first resolution with each other is performed. In this process, since the resolution of the image increases from the first resolution to the second resolution, the first QSM assembled map 41 of FIG. 4 has a form in which distortion occurs from the second QSM map 42 of FIG. 1. This will be described in another way with reference to FIGS. 8A and 8B.

FIG. 8A is a diagram for describing the cause of distortion present in the QSM assembled map generated according to the embodiment shown in FIG. 4.

As shown in FIG. 8A, the first QSM assembled map 41 of FIG. 4 can be regarded as the same as the result of reconstructing the first image 21 of FIG. 4 using the QSM map reconstruction module 70. In this case, the QSM map reconstruction module 70 becomes the result of performing deconvolution using a third dipole kernel having the third frequency signal 73 shown in the lower part of FIG. 7.

The QSM map reconstruction module 70 may be, for example, a COSMOS module.

FIG. 8B illustrates a process of accurately generating a QSM map from the first image 21 of FIG. 8A. In FIG. 8B, a final QSM map 161 having the second resolution may be generated by the first image 21 having the second resolution and the second dipole kernel having the second resolution. Reference numeral 72 in FIG. 8B indicates the frequency signal of the second dipole kernel.

As such, since the dipole kernels used in FIGS. 8A and 8B are different from each other, the first QSM assembled map 41 reconstructed from the first image 21 which is the same input and the final QSM map 161 are different images. The final QSM map 161 is an accurate image and the first QSM assembled map 41 is an image having distortion.

Now, it can be understood that the difference between the first QSM assembled map 41 and the final QSM map 161 originates from the difference between the third dipole kernel and the second dipole kernel.

Accordingly, when the first QSM assembled map 41 is calibrated using the difference between the third dipole kernel and the second dipole kernel, the final QSM map 161 can be generated. That is, the final QSM map 161, which is a result substantially free of errors, can be generated from the first QSM assembled map 41, which is a result including errors, by the calibration.

Hereinafter, a preferred embodiment of the present disclosure including such a calibration method will be described.

Embodiment 3—One Preferred Embodiment of the Present Disclosure

FIG. 9A is a block diagram illustrating a method of generating a QSM map in accordance with a preferred embodiment of the present disclosure.

Blocks indicated by reference numerals 10, 21, 1021, 31, 1041, and 41 in FIG. 9A and their interactive relationship are the same as those shown in FIG. 4.

A calibration unit 50 of FIG. 9A is configured to calibrate the first QSM assembled map 41 to generate a first QSM map 61.

FIG. 9B is a diagram illustrating an operating principle of the calibration unit illustrated in FIG. 9A.

The calibration unit 50 may execute step S510, step S520, and step S530.

In step S510, the calibration unit 50 may generate a first QSM assembled map frequency signal 51, which is information on the frequency domain of the first QSM assembled map 41, by Fourier transforming the first QSM assembled map 41 having the second resolution.

In this case, the first QSM assembled map 41 itself is information on the image domain. And since the first QSM assembled map 41 has the second resolution, the first QSM assembled map frequency signal 51 is defined in the section where $k_x$ is $[-b_2, b_2]$.

In step S520, the calibration unit 50 may generate a first QSM map frequency signal 52 by compensating the first QSM assembled map frequency signal 51 based on the difference between the second dipole kernel and the third dipole kernel.

The first QSM map frequency signal 52 is information on the frequency domain.

In this case, the second dipole kernel and the third dipole kernel may be provided as signals of the same domain as the first QSM assembled map frequency signal 51. Both the second dipole kernel and the third dipole kernel may be signals defined in the section where $k_x$ is $[-b_2, b_2]$.

In this case, in the section where $k_x$ is $[-b_1, b_1]$, the second dipole kernel and the third dipole kernel may be the same. Accordingly, the compensation described above may not be performed in the section where $k_x$ is $[-b_1, b_1]$.

However, in a section where $k_x$ is $[-b_2, -b_1]$ and in a section where $k_x$ is $[b_1, b_2]$, the second dipole kernel and the third dipole kernel are different from each other. Accordingly, the compensation described above can be executed in a section where $k_x$ is $[-b_2, -b_1]$ and in a section where $k_x$ is $[b_1, b_2]$.

In step S530, the calibration unit 50 may generate the first QSM map 61 by Fourier transforming the first QSM map frequency signal 52.

As described in FIG. 9B, the calibration of map (image) by the calibration unit 50 may be performed in the frequency domain.

According to an embodiment of the present disclosure, a process of performing the calibration shown in FIG. 9A may include steps shown in FIG. 10A or 10B.

FIG. 10A is a flowchart illustrating a method of calibrating a reconstructed QSM map according to an embodiment of the present disclosure.

In step S310, first resolution which is the same as the resolution of the QSM sub map 1041 is acquired, and second resolution which is the same as the resolution of the first QSM assembled map 41 is acquired.

In step S320, a first dipole kernel represented by the first resolution and a second dipole kernel represented by the second resolution in the image domain are acquired.

However, in this case, the shape and size of the first dipole kernel in the image domain are the same as the shape and size of the second dipole kernel in the image domain. However, only the first resolution representing the first dipole kernel and the second resolution representing the second dipole kernel in the image domain are different from each other.

In step S330, a third dipole kernel obtained by performing a resolution change on the first dipole kernel to have the second resolution is generated. The third dipole kernel may also be referred to as a 'first dipole kernel with changed resolution'.

In step S340, third image domain data which is image domain data of the third dipole kernel and second image domain data which is image domain data of the second dipole kernel are acquired.

In step S350, the first QSM map 61 is generated by calibrating the first QSM assembled map 41 based on the difference value between the third image domain data and the second image domain data.

FIG. 10B is a flowchart illustrating a method of calibrating a reconstructed QSM map according to another embodiment of the present disclosure.

That is, in step S1310, first resolution which is the same as the resolution of the QSM sub map 1041 is acquired, and second resolution which is the same as the resolution of the first QSM assembled map 41 is acquired.

In step S1320, a first dipole kernel represented by the first resolution and a second dipole kernel represented by the second resolution in the image domain are acquired.

However, in this case, the shape and size of the first dipole kernel in the image domain are the same as the shape and size of the second dipole kernel in the image domain. However, only the first resolution representing the first dipole kernel and the second resolution representing the second dipole kernel in the image domain are different from each other.

In step S1330, a third dipole kernel obtained by performing sampling conversion on the first dipole kernel to have the second resolution is generated. The third dipole kernel may also be referred to as 'first dipole kernel subjected to sampling conversion'.

That is, the first dipole kernel subjected to sampling conversion to have the second resolution is the same as the third dipole kernel.

In step S1340, third frequency domain data which is frequency domain data of the third dipole kernel and second frequency domain data which is frequency domain data of the second dipole kernel are acquired.

In step S1350, the first QSM map 61 is generated by calibrating the first QSM assembled map 41 based on the difference value between the third frequency domain data and the second frequency domain data.

FIG. 11 is a block diagram for describing the accuracy of the QSM map generated according to the method of reconstructing the QSM map according to the embodiment of the present disclosure shown in FIG. 9A.

A QSM map 61' having the second resolution may be generated by inputting the first image 21 shown in FIG. 9A to any known QSM map reconstruction module 70.

In this case, in order to operate the QSM map reconstruction module 70, the QSM map reconstruction module 70 uses the second dipole kernel having the second resolution.

If the QSM map reconstruction module 70 is THE COSMOS, the generated QSM map 61' is generally regarded as reliable at the current state of the art.

In this case, the first QSM map 61 generated according to the embodiment of the present disclosure shown in FIG. 9A has a very small error from the QSM map 61'. Therefore, the embodiment of the present disclosure shown in FIG. 9A has an effect of generating an accurate QSM map.

In addition, since specific values of the first resolution and the second resolution presented in the embodiment of the present shown in FIG. 9A are not limited, there is an effect that the QSM map of the first image 21 having arbitrary second resolution can be accurately obtained by using the first inference network trained with the input images for training having the first resolution. As a result, there is an advantage in that there is no need to prepare various inference networks trained at various resolutions in order to obtain the accurate QSM map from various MRI images having various resolutions, and only one or a limited number of inference networks need to be prepared.

FIG. 12 is a flowchart illustrating a method of generating the QSM map according to an embodiment of the present disclosure.

In step S110, the computing device may generate a first set of sub-images by performing downsampling on the first image.

In this case, the first image may be an image having 'second resolution' larger than predetermined resolution.

In this case, each of the sub-images may be an image having 'first resolution' smaller than the predetermined resolution.

In this case, the first image may be the MRI image acquired using the MRI canner.

In this case, the first set of sub-images may be composed of N sub-images.

In this case, each sub-image may be an image generated by being subjected to downsampling from the MRI image, and may be referred to as an MRI sub-image in the present specification. The MRI sub-image is a kind of MRI image.

In this case, the second resolution, which is the size of the first image, may be larger than the first resolution, which is the size of each of the sub-images (second resolution>first resolution).

In step S120, the computing device may input respective sub-images constituting the first set of sub-images to a predetermined first inference network and generate a first set of QSM sub-maps composed of QSM sub-maps corresponding to the respective sub-images.

In this case, the first inference network may be a network that receives the MRI image and outputs the QSM map corresponding to the input MRI image. Accordingly, when one sub-image is input to the first inference network, the first inference network may output one QSM sub-map.

In this case, the first inference network may be a network including a first neural network. And the first inference network may be one that is obtained by training the first neural network.

In this case, the first neural network may be one that is trained using a first set of input images for training having the first resolution which is the same size as the sub-image.

When the first set of sub-images is composed of a total of N sub-images, each of the N sub-images may be sequentially input to the first inference network, and the first inference network may sequentially output N QSM sub-maps corresponding to the N sub-images. That is, the inference network may output a first set of QSM sub-maps corresponding to the first set of sub-images.

In the modified embodiment, the first inference network may process k sub-maps among the N sub-images in parallel and output k QSM sub-maps corresponding to the k sub-images at once (1<=k<N).

In step S130, the computing device may generate one completed first QSM assembled map by assembling the first set of QSM sub-maps.

In this case, the size of the first QSM assembled map may be larger than the size of each of the QSM sub-maps.

In step S140, the computing device may generate a first QSM map by calibrating the first QSM assembled map using a method according to an embodiment of the present disclosure.

In this case, quality of the first QSM map generated in the step S140 is better than quality of the final QSM map generated in the step S240 of FIG. 5. This is an effect that can be obtained as a result of calibration by the method according to an embodiment of the present disclosure. The specific method of the calibration is as described above with reference to FIGS. 10A and 10B.

In this case, the size of the first QSM assembled map may be the same as the size of the first QSM map.

FIG. 13 is a flowchart illustrating a method of generating a QSM map according to another embodiment of the present disclosure.

In step S410, a high-resolution image (second resolution) may be generated by performing upsampling on the first image (first resolution) (first resolution<second resolution).

In step S420, a high-resolution QSM map may be generated by inputting the high-resolution image (second resolution) to a predetermined second inference network.

In this case, the second inference network may be one that is trained using the second set of input images for training having the second resolution.

In step S430, a first QSM map may be generated by calibrating the high-resolution QSM map using the method according to an embodiment of the present disclosure.

FIG. 14A is a flowchart illustrating a method of calibrating the high-resolution QSM map in FIG. 13 according to an embodiment.

In step S1410, a first dipole kernel represented by the first resolution and a second dipole kernel represented by the second resolution in the image domain are acquired.

In step S1420, a third dipole kernel obtained by performing resolution conversion on the second dipole kernel to have the first resolution is generated. The third dipole kernel may also be referred to as a 'second dipole kernel with converted resolution'.

In step S1430, third image domain data which is image domain data of the third dipole kernel and first image domain data which is image domain data of the first dipole kernel are acquired.

In step S1440, the first QSM map is generated by calibrating the high-resolution QSM map based on the difference value between the third image domain data and the first image domain data.

FIG. 14B is a flowchart illustrating a method of calibrating the high-resolution QSM map in FIG. 13 according to another embodiment.

In step S2410, a first dipole kernel represented by the first resolution and a second dipole kernel represented by the second resolution in the image domain are acquired.

In step S2420, a third dipole kernel obtained by performing resolution conversion on the second dipole kernel to have the first resolution is generated. The third dipole kernel may also be referred to as a 'second dipole kernel with converted resolution'.

In step S2430, third frequency domain data which is frequency domain data of the third dipole kernel and first frequency domain data which is frequency domain data of the first dipole kernel are acquired.

In step S2440, the first QSM map is generated by calibrating the high-resolution QSM map based on the difference value between the third frequency domain data and the first frequency domain data.

FIG. 15 is a diagram illustrating a method of assembling shown in FIG. 9A.

A plurality of QSM sub-maps 1041 have the same first resolution. Accordingly, pixels located in specific columns and rows of respective QSM sub-maps 1041 may be grouped into one group. For example, if one QSM sub-map 1041 is composed of a total of M pixels, M groups may be defined from the plurality of QSM sub-maps 1041.

FIG. 15 illustrates a case in which four QSM sub-maps 1041 exist, and the QSM sub-maps are divided into reference symbols a, b, c, and d, respectively.

Marked as a, b, c, and d in the squares on the left side of FIG. 15 represent four pixels corresponding to each other, and these four pixels form one group.

A region k corresponding to the pixels a, b, c, or d exists in the first QSM assembled map 41 having the second resolution. The region k may include a plurality of pixels. Values of a plurality of pixels in the region k may be determined based on values of the one group of pixels a, b, c, and d corresponding to the region k.

In the example of FIG. 15, the region k includes 4 pixels, and values of the pixels a, b, c, and d are input as the values of the 4 pixels.

In another embodiment, the number of pixels included in the region k may not be an integer multiple of the number of the plurality of QSM sub-maps 1041. Even in this case, the values of the plurality of pixels in the region k may be determined based on the values of the one group of pixels a, b, c, and d corresponding to the region k.

FIG. 16 is a diagram illustrating a configuration of an MRI system implementing a method of generating a QSM map according to an embodiment of the present disclosure.

An MRI system 1000 may include the MRI scanner 10 and a computing device 100.

The MRI scanner 10 may include a separate computing part distinguished from the computing device 100, but this is not illustrated.

The MRI scanner 10 may provide the MRI image to the computing device 100. Specifically, a local field map obtained by post-processing a phase of an MRI image obtained by the GRE method may be provided.

The MRI image may be transmitted through a device interface 210 included in the MRI scanner 10 and a device interface 3 included in the computing device 100.

The MRI scanner 10 is a device including a coil 210 and a permanent magnet, and may be a device having a space capable of accommodating a measurement target such as a person. The MRI scanner 10 may output the MRI image.

The computing device 100 may include the device interface 3, a non-volatile recording medium 2, and a processing unit 4.

The non-volatile recording medium 2 may be a storage device such as HDD, SSD, or CD-ROM.

The processing unit 4 may include an operation device such as FPGA or ASIC.

A resampling part 401, an inference network part 402, an assembling part 403, and a calibration part 404 can be implemented by the processing unit 4.

The resampling part 401, the inference network part 402, the assembling part 403, and the calibration part 404 can be implemented by the processing unit 4 reading and executing a first command code, a second command code, a third command code, and a fourth command code stored in the non-volatile recording medium 2, respectively.

The resampling part 401 may be a part that performs a function of resampling the first image 21 of FIG. 9A and converting the same into the plurality of sub-images 1021.

The inference network part 402 may be a part that implements the operation of the first inference network 31 of FIG. 9A.

The assembling part 403 may be a part that generates the first QSM assembled map 41 by assembling the plurality of QSM sub-maps 1041 of FIG. 9A with each other.

The calibration part 404 may be a part that generates the first QSM map 61 by calibrating the first QSM assembled map 41 of FIG. 9A.

The generated first QSM map 61 may be output through a display 5, printed by a printing device 6, or stored in the non-volatile recording medium 2.

Using the embodiments of the present disclosure described above, those skilled in the art of the present invention will be able to easily implement various changes and modifications within a range that does not deviate from the essential characteristics of the present disclosure. The content of each claim of the claims may be combined with other claims that have no citation relationship with the claim within the scope understandable through this specification.

When using the QSM map generation method of the present disclosure, data having various resolutions can be reconstructed using a given network trained at specific resolution.

Although the method of reconstructing the QSM map using dipole compensation has been described with reference to the specific embodiments, it is not limited thereto. Therefore, it will be readily understood by those skilled in the art that various modifications and changes can be made thereto without departing from the spirit and scope of the present invention defined by the appended claims.

<Acknowledgement>

This work has been supported by the National Research Foundation of Korea(NRF) grant funded by the Korea government(MSIT)(Nos. NRF-2021R1A2B5B03002783 and NRF-2019M3C7A1031994).

What is claimed is:

1. A method of generating a QSM map comprising:
   acquiring, by an MRI system, an image having a second resolution by scanning an object using an MRI scanner;
   generating, by the MRI system, a plurality of sub-images having a first resolution from the image;
   generating, by the MRI system, a plurality of QSM sub-maps having the first resolution from the plurality of sub-images using an inference network;
   generating, by the MRI system, one QSM assembled map having the second resolution by assembling the plurality of QSM sub-maps with each other, and
   generating, by the MRI system, a QSM map having the second resolution by calibrating the one QSM assembled map,
   wherein,
   the calibration is performed based on a difference between a second dipole kernel represented by the second resolution and a third dipole kernel represented by the second resolution, and
   the third dipole kernel is obtained by performing sampling conversion on a first dipole kernel represented by the first resolution so that the first dipole kernel is represented by the second resolution.

2. The method of claim 1, wherein
   the generating of the QSM map comprises
   generating, by the MRI system, a first QSM assembled map frequency signal by Fourier transforming the generated one QSM assembled map,
   generating, by the MRI system, a first QSM map frequency signal by calibrating the generated first QSM assembled map frequency signal based on a difference between the second dipole kernel and the third dipole kernel, and
   generating, by the MRI system, a QSM map having the second resolution by Fourier transforming the generated first QSM map frequency signal.

3. The method of claim 1, wherein
   the second resolution is larger than the first resolution,
   a first frequency signal, which is a frequency domain signal of the first dipole kernel, is defined in a section where kx is [−b1, b1],
   both a second frequency signal, which is a frequency domain signal of the second dipole kernel, and a third frequency signal, which is a frequency domain signal of the third dipole kernel, are defined in a section where kx is [−b2, b2] (b2>b1),
   the second frequency signal and the third frequency signal are equal to each other in a section where kx is [−b1, b1], and the second frequency signal and the third frequency signal are different from each other in a section where kx is [−b2, −b1] and a section where kx is [b1, b2], and
   the calibration is performed in the section where kx is [−b2, −b1] and the section where kx is [b1, b2].

4. The method of claim 3, wherein
   a value of the first QSM map frequency signal at kx=k is a value obtained by multiplying the value of the first QSM assembled map frequency signal at kx=k by a predetermined value,
   the predetermined value is a value obtained by dividing a value of the third frequency signal at kx=k by a value of the second frequency signal at kx=k, and
   the k is a value belonging to the section where kx is [−b2, −b1] and the section where kx is [b1, b2].

5. The method of claim 1, wherein
   the inference network is trained by supervised learning using a plurality of input images for training having the first resolution and using a plurality of QSM maps generated from the plurality of input images for training as labels.

6. The method of claim 1, wherein
all of the plurality of sub-images have the same horizontal and vertical size,
all of the plurality of QSM sub-maps have the same horizontal and vertical size, and
the second resolution is larger than the first resolution.

7. The method of claim 6, wherein
a plurality of pixels included in a first region of the QSM assembled map include a plurality of pixels located at a first position corresponding to each other in the plurality of QSM sub-maps.

8. The method of claim 1, wherein
the plurality of sub-images are different images obtained by performing downsampling on the image.

9. A method of generating a QSM map comprising:
acquiring, by an MRI system, an image having first resolution by scanning an object using an MRI scanner;
generating, by the MRI system, one upsampling image having second resolution larger than the first resolution from the image;
generating, by the MRI system, one QSM upsampling map having the second resolution from the upsampling image using an inference network; and
generating, by the MRI system, one QSM map having the first resolution by calibrating the one QSM upsampling map having the second resolution.

10. An MRI system comprising:
an MRI scanner; and
a computing device, wherein
the computing device is configured to execute
acquiring an image having second resolution by scanning an object using the MRI scanner,
generating a plurality of sub-images having first resolution from the image,
generating a plurality of QSM sub-maps having the first resolution from the plurality of sub-images using an inference network,
generating one QSM assembled map having the second resolution by assembling the plurality of QSM sub-maps with each other, and
generating a OSM map having the second resolution by calibrating the one QSM assembled map,
the calibration is performed based on a difference between a second dipole kernel represented by the second resolution and a third dipole kernel represented by the second resolution, and
the third dipole kernel is obtained by performing sampling conversion on a first dipole kernel represented by the first resolution so that the first dipole kernel is represented by the second resolution.

11. The MRI system of claim 10, wherein
the generating of the QSM map comprises
generating, by the MRI system, a first QSM assembled map frequency signal by Fourier transforming the generated one QSM assembled map,
generating, by the MRI system, a first QSM map frequency signal by calibrating the generated first QSM assembled map frequency signal based on a difference between the second dipole kernel and the third dipole kernel, and
generating, by the MRI system, a QSM map having the second resolution by Fourier transforming the generated first QSM map frequency signal.

12. The MRI system of claim 10, wherein
the inference network is trained by supervised learning using a plurality of input images for training having the first resolution and using a plurality of QSM maps generated from the plurality of input images for training as labels.

13. A method of generating a QSM map comprising:
acquiring, by a computing device, an image having second resolution by scanning an object using an MRI scanner;
generating, by the computing device, a plurality of sub-images having first resolution from the image;
generating, by the computing device, a plurality of QSM sub-maps having the first resolution from the plurality of sub-images using an inference network;
generating, by the computing device, one QSM assembled map having the second resolution by assembling the plurality of QSM sub-maps; and
generating, by the computing device, a QSM map having the second resolution by calibrating the one QSM assembled map, wherein
the calibration is performed based on a difference between a second dipole kernel represented by the second resolution and a third dipole kernel represented by the second resolution, and
the third dipole kernel is obtained by performing sampling conversion on a first dipole kernel represented by the first resolution so that the first dipole kernel is represented by the second resolution.

* * * * *